(12) United States Patent
Robinson et al.

(10) Patent No.: US 7,583,202 B2
(45) Date of Patent: Sep. 1, 2009

(54) METHOD AND APPARATUS FOR AN ELECTRIC METER

(75) Inventors: Andrew John Robinson, Los Gatos, CA (US); Spencer Syd Bachoo, Los Gatos, CA (US); Carlos A. Cuturrufo, Aptos, CA (US); Darron Werner Fick, San Jose, CA (US); Glen Meyers Riley, Saratoga, CA (US); Haoqing Sun, San Jose, CA (US); Deniz Teoman, San Mateo, CA (US); Mingyu Wang, San Jose, CA (US); Kathryn Anne Zybura, Scotts Valley, CA (US)

(73) Assignee: Echelon Corporation, San Jose, CA (US)

( * ) Notice: Subject to any disclaimer, the term of this patent is extended or adjusted under 35 U.S.C. 154(b) by 274 days.

(21) Appl. No.: 10/969,289

(22) Filed: Oct. 19, 2004

(65) Prior Publication Data

US 2006/0091877 A1 May 4, 2006

(51) Int. Cl.
*G08B 23/00* (2006.01)
(52) U.S. Cl. ............... 340/870.02; 324/110; 700/295; 710/305; 379/106.03; 379/106.04
(58) Field of Classification Search ............ 340/870.02; 324/110; 700/295; 710/305; 379/106.3
See application file for complete search history.

(56) References Cited

U.S. PATENT DOCUMENTS

| | | | | |
|---|---|---|---|---|
| 4,977,515 | A * | 12/1990 | Rudden et al. | 700/296 |
| 5,553,094 | A * | 9/1996 | Johnson et al. | 375/130 |
| 5,963,650 | A | 10/1999 | Simionescu et al. | |
| 5,994,892 | A * | 11/1999 | Turino et al. | 324/142 |
| 6,271,523 | B1 | 8/2001 | Weaver et al. | |
| 6,538,577 | B1 * | 3/2003 | Ehrke et al. | 340/870.02 |
| 6,638,028 | B1 | 10/2003 | Poulin, Jr. | |
| 6,954,814 | B1 * | 10/2005 | Leach | 710/305 |
| 2002/0032535 | A1 | 3/2002 | Alexander et al. | |
| 2002/0074990 | A1 | 6/2002 | Shincovich | |
| 2003/0151415 | A1 | 8/2003 | Randall et al. | |
| 2006/0202858 | A1 * | 9/2006 | Holle et al. | 340/870.02 |

FOREIGN PATENT DOCUMENTS

EP    1 379 012 A1    1/2004

OTHER PUBLICATIONS

Freescale Semiconductor, "M68HC11E Family", Data Sheet, HC11 Microcontrollers, Rev. 5.1, www.freescale.com, (Jul. 2005), 242 pages.

(Continued)

*Primary Examiner*—Timothy Edwards, Jr.
(74) *Attorney, Agent, or Firm*—Blakely, Sokoloff, Taylor & Zafman LLP

(57) ABSTRACT

An improved meter and its operation is described. The meter can be a part of a larger automated meter reading process that allows for remote reading of the meter though power line communication. Using a microcomputer core, the meter processes incoming analog data and can calculate several relevant data values need by utility providers. The meter can also be used to monitor and detect tampering dry connect/voltage free devices, such as gas and water meters, connected to the meter.

31 Claims, 22 Drawing Sheets

OTHER PUBLICATIONS

Notification of Transmittal of International Search Report and Written Opinion of the International Searching Authority, or the Declaration for International Application No. PCT/US05/30620, mailed on Apr. 18, 2006, pp. 11 total.

Notification of Transmittal of International Preliminary Report on Patentability for International Application No. PCT/US05/30620, mailed on Nov. 21, 2006, pp. 6 total.

* cited by examiner

| Calibration Sequence Number | Procedure Name | Inputs |
| --- | --- | --- |
| 0 | VAR SIN1 HI GAIN | 230V, 40A, 90 degree |
| 1 | W PF1 HI GAIN | 230V, 40A, 0 degree |
| 2 | VAR SIN05 IND HI GAIN | 230V, 40A, 30 degree |
| 3 | VAR SIN05 CAP HI GAIN | 230V, 40A, 150 degree |
| 4 | VAR SIN1 HI OFF | 230V, 2A, 90 degree |
| 5 | VAR SIN05 IND HI OFF | 230V, 2A, 30 degree |
| 6 | VAR SIN05 CAP HI OFF | 230V, 2A, 150 degree |
| 7 | W PF05 IND HI GAIN | 230V, 40A, 60 degree |
| 8 | W PF05 CAP HI GAIN | 230V, 40A, -60 degree |
| 9 | W PF1 HI OFF | 230V, 2A, 0 degree |
| 10 | W PF05 IND HI OFF | 230V, 2A, 60 degree |
| 11 | W PF05 CAP HI OFF | 230V, 2A, -60 degree |
| 12 | VAR SIN1 LO GAIN | 230V, 1A, 90 degree |
| 13 | W PF1 LO GAIN | 230V, 1A, 0 degree |
| 14 | VAR SIN05 IND LO GAIN | 230V, 1A, 30 degree |
| 15 | VAR SIN05 CAP LO GAIN | 230V, 1A, 150 degree |
| 16 | VAR SIN1 LO OFF | 230V, 0.25A, 90 degree |
| 17 | VAR SIN05 IND LO OFF | 230V, 0.25A, 30 degree |
| 18 | VAR SIN05 CAP LO OFF | 230V, 0.25A, 150 degree |
| 19 | W PF05 IND LO GAIN | 230V, 1A, 60 degree |
| 20 | W PF05 CAP LO GAIN | 230V, 1A, -60 degree |
| 21 | W PF1 LO OFF | 230V, 0.25A, 0 degree |
| 22 | W PF05 IND LO OFF | 230V, 0.25A, 60 degree |
| 23 | W PF05 CAP LO OFF | 230V, 0.25A, -60 degree |

Fig. 22

METHOD AND APPARATUS FOR AN ELECTRIC METER

BACKGROUND

1. Field of the Invention

The present invention relates to the field of metering and metering communication systems.

2. Description of the Related Art

Tracking and controlling energy consumption is a global concern. Utility providers, such as power, gas, and water, meter how much a particular customer uses over a period of time. Traditionally, the utility provider would have to physically send a person to the customer's location to read the meter to make this determination. This is costly, time consuming, and did not occur on a continual basis. This method of monitoring can also lead to a customer tampering with the utility providers' metering devices so as to create the appearance of not using as much of the utility as was actually used.

In order to deal with these some of these pitfalls automatic meter reading (AMR) was developed. AMR is a technique of reading a meter remotely. One way of accomplishing this is to have the meter generate a short range radio signal to be read by the utility provider. This signal will simply give the utility provider the number of kilowatt hours (kWh), gallons of water, etc. used by the consumer over a set period of time. However, the utility provider must still send out a person to be close enough to receive that signal. The meter may or may not provide for a tampering notification.

Metering devices have also traditionally used expensive application specific integrated circuits (ASICs) or digital signal processors (DSPs) to perform the needed calculations on incoming data.

SUMMARY

The present invention includes a metering apparatus at least which includes a microcomputer and a transceiver unit, a memory, analog transducers, and electronically operated relay coupled to the microcomputer. The invention further includes a method of operating a meter which includes operating in a normal mode, a watch mode, and a stop mode.

BRIEF DESCRIPTION OF THE DRAWINGS

FIG. 22 illustrates an embodiment of a self-calibration procedure to be used during the manufacturing process

DETAILED DESCRIPTION

A meter for automatic meter reading and power line communication is described. In the following description, numerous specific details are set forth such as specific circuit components and associated potentials, in order to provide a thorough understanding of the present invention. It will be apparent to one skilled in the art, that the present invention may be practiced without these specific details. In other instances, well-known electrical circuit designs and implementations are not described in detail in order to not unnecessarily obscure the present invention.

Meter as a Part of Networked Energy Services

The meter of the present invention is a service provider to a larger system called networked energy services (NES). The meter in this system provides modern utilities with the tools that are needed to streamline their day-to-day metering operations. The meter is a solid-state electric energy meter capable of operation on worldwide voltage networks. Among the main tasks of the meter are to perform traditional metering tasks such as to measure active and reactive power and to accumulate active and reactive energy. Additionally, the meter has the capability to exchange information with other devices on the NES system by communicating through the power lines utilizing power line communication (PLC) technology.

Figure 1:
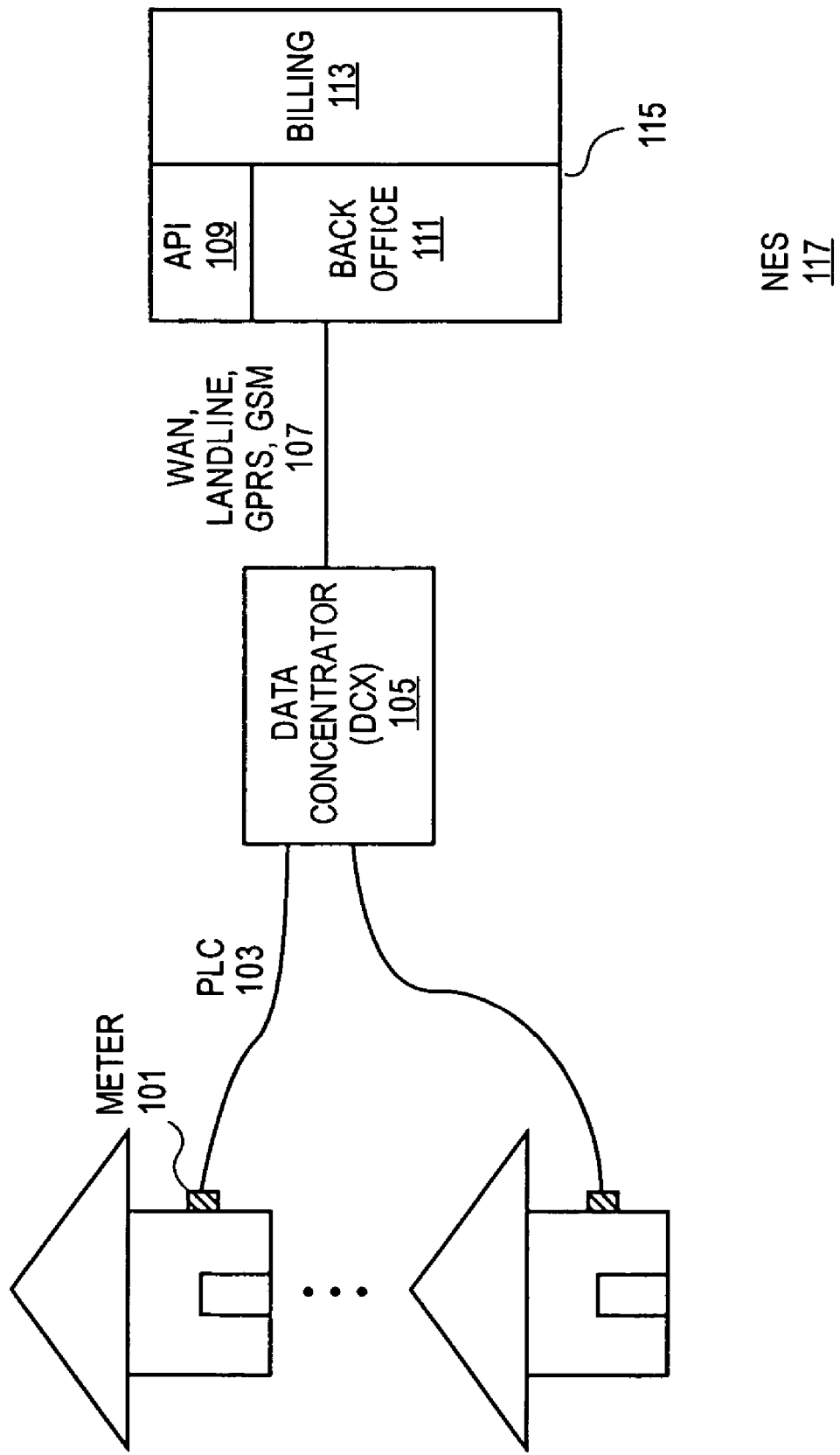
FIG. 1 illustrates an embodiment of a networked energy services system.

An exemplary embodiment of the NES 117 system is depicted in FIG. 1. A meter 101, attached to a structure such as a residential or commercial building, uses PLC 103 to communicate to a data collector (DCX) 105. In one embodiment PLC is provided by Echelon Corporation's LonTalk technology. The DCX 105 collects data from at least one meter and acts as a gateway for billing and operational data to be transferred from a meter 101 using a transmission protocol 107 to the utilities back office system 115. There is not a set number of meters that can communicate with one DCX 105 but in one embodiment not more than 1,000 meters are connected to a single DCX 105. Exemplary transmission protocols 107 include, but are not limited to, WAN, GPRS, GSM, and land line communications. Generally, the amount of data transferred from a meter 101 to the DCX 105 is small. This data includes but is not limited to billing, power quality, profiling, configuration, and prepayment data. A meter 101 may be polled for data at any time using the back office system in conjunction with the DCX 105 or by the DCX 105 running a routine without the back office system 115. The back office system 115 has an application program interface (API) 109 for displaying information, running back office utilities 111, and billing software 113. Meters 101 may also be configured to communicate with each other using the DCX 105 and PLC 103.

One embodiment of the NES 117 system collects data from a meter 101 when power consumption on the network is lower such as during the night. By collecting data overnight, devices that would normally provide interference on the power line, for example HVAC and television, would more likely not be in use and less filtering of the incoming data would have to be performed. In another embodiment, data collection is done at any time desired.

One embodiment of the NES system allows for a meter's 101 software and firmware to be updated remotely using PLC 103 or reprogrammed in the field by a technician. This capability allows for the meter to be adjustable according to a utility provider's needs and allows for the adjustment of current settings. Current settings may need to be adjusted, for example, to help preserve battery life by not testing the battery as often or shortening the time that the meter is in watch mode when main power to the meter is lost. Additionally, the meter's 101 firmware may need upgrading to preserve battery life or upgrade the capabilities of the meter 101.

An Embodiment of a Meter and its Capabilities

Figure 2:
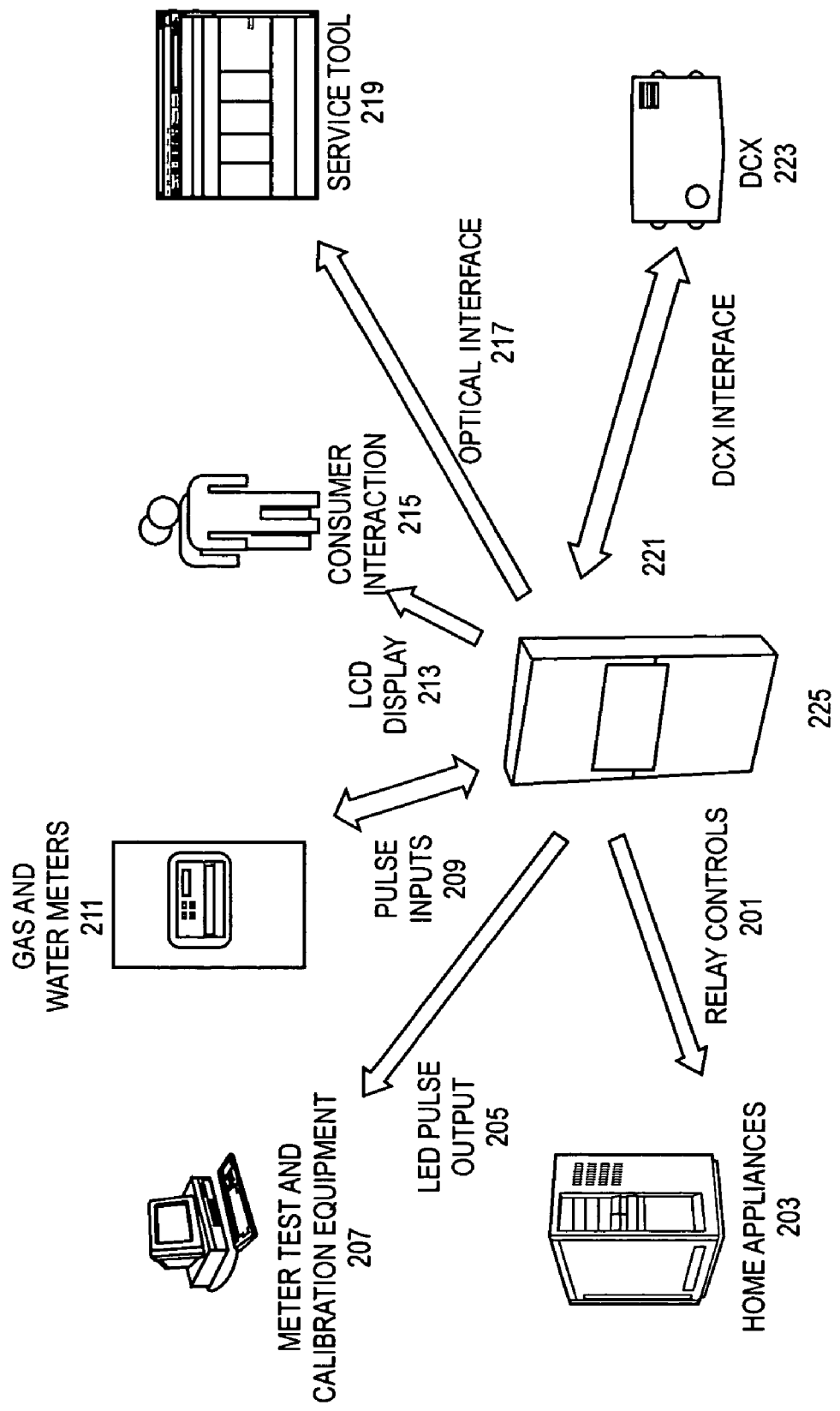
FIG. 2 illustrates an embodiment of a meter.

FIG. 2 illustrates an embodiment of a meter 225 and its capabilities. The meter 225 can be configured to connect to devices 203 such as home appliances using relay controls 201. This allows the meter 225 to perform power saving functions such as turning off HVAC appliances during times of heavy power consumption and thus helping ease potential brownout conditions. Additionally, the meter 225 could use the relay controls 201 to allow a home user to selectively turn off appliances remotely. The ability to remotely power off such appliances will help lead to cost savings for the consumer and help ease burdens on existing power providers during high load times.

The meter 225 can also use a light emitting diode (LED) pulse output 205 to help in the calibration and testing 207 of the meter 225. Of course, other technologies aside for LED could be used to assist in meter testing and calibration.

Gas or water meters 211 and other dry connect/voltage free devices can be connected to the meter 225 using pulse inputs 209. Optionally, the pulse inputs 209 can be integrated with tamper detection to alert the meter 225 and utility provider if there is a disconnect or other tampering of the gas or water meters 211.

A display 213 associated with the meter 225 allows for consumer interaction with the meter 225. Using the display 213, the meter 225 can display information including but not limited to active energy, reactive energy, prepay credit, line voltage, line wiring configuration, meter date, meter time, reactive power, active power, disconnect status, relay status, PLC communication indication, and tamper indication. In one embodiment the display 213 is a liquid crystal display (LCD). However, those in the art will appreciate that a other technologies can be used such as organic light emitting diode (OLED), LED, and light emitting plastic (plastic TFT) can be used. In another embodiment, the meter does not have a display on the device but can be connected to an external display.

An optical interface 217 provides communication capability with the meter 225 and an external service tool 219. Exemplary service tools 219 include but are not limited to handheld readers. In an embodiment this optical interface is provided for by an infrared optical port which is mechanically based on the International Electrotechnical Commission IEC1107 standard. The data transfer protocol however is based on the American National Standards Institute (ANSI) C12.18 standard. This port also provides two-way half duplex communications capability to be utilized for calibration and test purposes during manufacturing and provisioning of the meter at the utility's service depot.

The meter 225 connects 221 to a data collection service or device 223. This data collection device or service 223 collects data from a single or multiple meters to be used by either the utility provider or the user. Uses for the data include billing, usage numbers, and problem indication. The data collection service or device 223 can also communicate with the meter 225 to alter settings of the meter 225.

Detailed Depiction of a Meter

Figure 3:
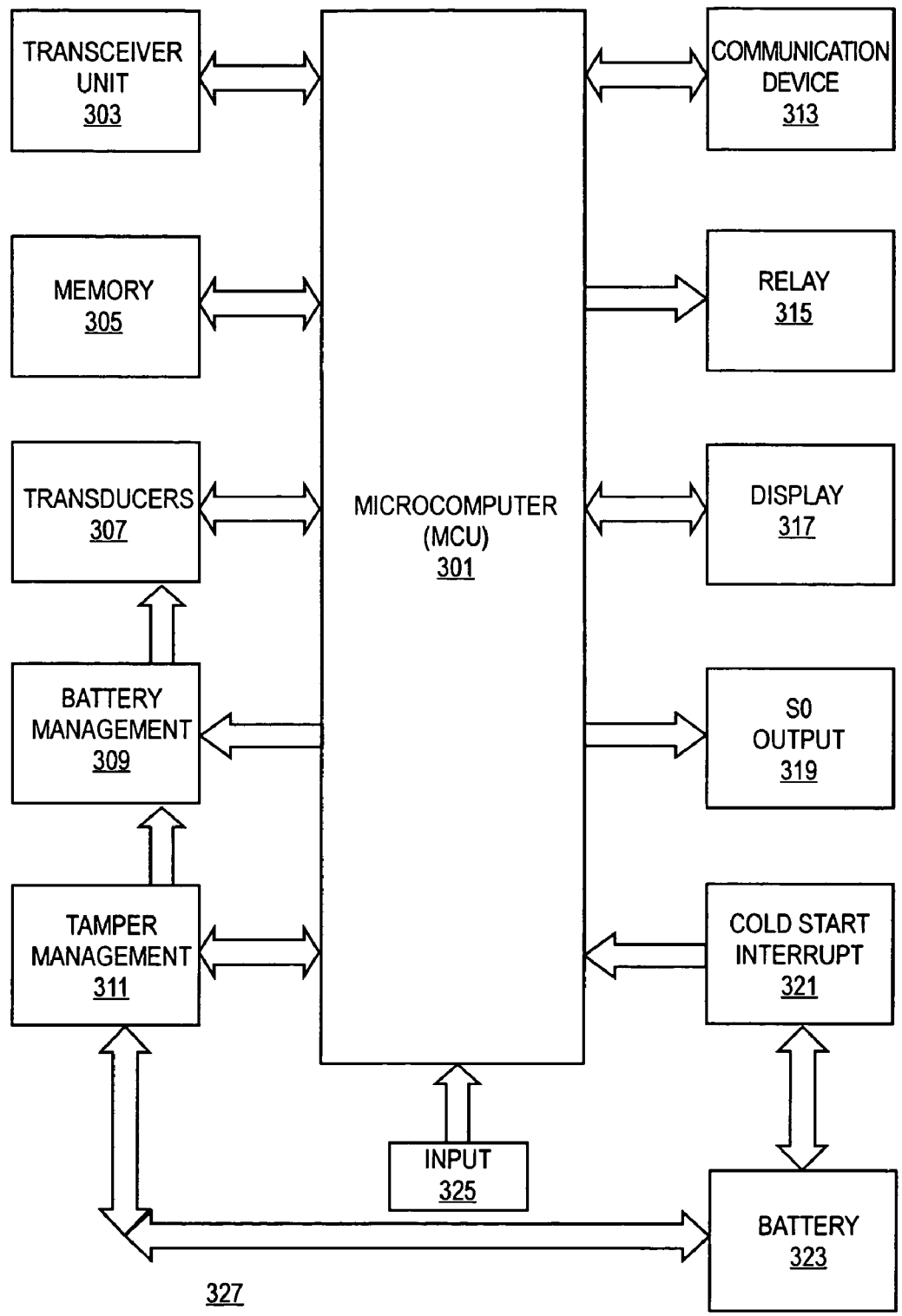
FIG. 3 illustrates an embodiment of components of a meter.

Turning now to FIG. 3, one embodiment of the meter is depicted. A microcomputer or microcontroller (MCU) 301 is central to the meter. The MCU 301 performs several tasks including, but not limited to, processing incoming analog signals, sensing temperature, managing meter power, detecting tampering, storing necessary software routines to further process incoming data, providing an optical interface, generating a real time clock (RTC), providing a S0 output, a display, internal power on reset and watchdog capabilities, and relay disconnect. Any MCU can be used and exemplary MCUs include, but are not limited to, Renesas' M16C/62, NES V850ES KG1, and Motorola's MMC2114.

Figure 4:
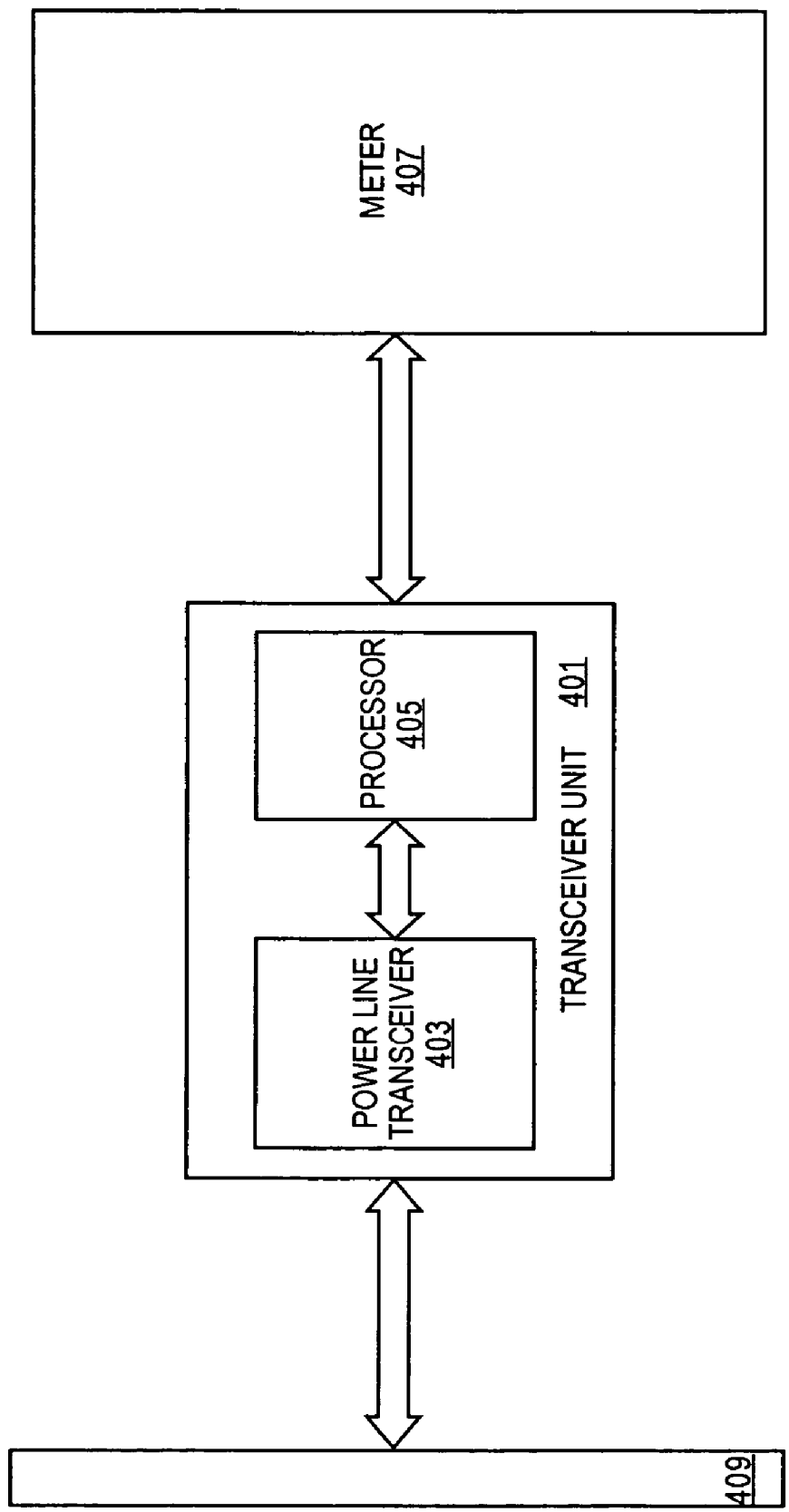
FIG. 4 illustrates an embodiment of a transceiver unit in communication with a power line and a meter.

In communication with the MCU 301 is a transceiver unit 303. The transceiver unit 303 provides an interface for power line communication (PLC). Turning now to FIG. 4, an exemplary embodiment of a transceiver unit 401 in communication with a power line 409 and a meter 407 is depicted. In this exemplary transceiver unit there is a processor 405, for running applications and managing communications, and a power line transceiver 403. Commercial embodiments of this type of receiver include but are not limited to Echelon Corporation's PL3120 and PL3150 power line smart transceivers. In another embodiment, the transceiver unit is just a power line transceiver and communication management is performed either by the MCU or a separate processing core.

Optionally, an external memory 305 is in communication with the MCU 301 to allow the meter to read and right data at high speeds and not be reliant on internal memory that may be used for other applications. The memory 305 also reduces the need for excessive power supply storage. Additionally, the memory 305 can provide real-time storage for profiling data, calibration data, and ANSI based meter tables. In one embodiment the external memory 305 is Ferroelectric Random-Access Memory (FRAM). FRAM has a data retention period of over 10 years and significant read/write endurance, which is important when dealing with the large amount of data storage capacity. On power-up and power-fail a dedicated firmware routine will handle housekeeping activities such that data held in the relevant ANSI tables can be immediately transferred between meter RAM and the external RAM without corruption.

Several analog transducers 307 are in communication with the MCU 301. These analog transducers 307 provide real-time data to the MCU 301 including, but not limited to, pulse input, voltage, current, temperature, and battery level sensing.

Figure 5:
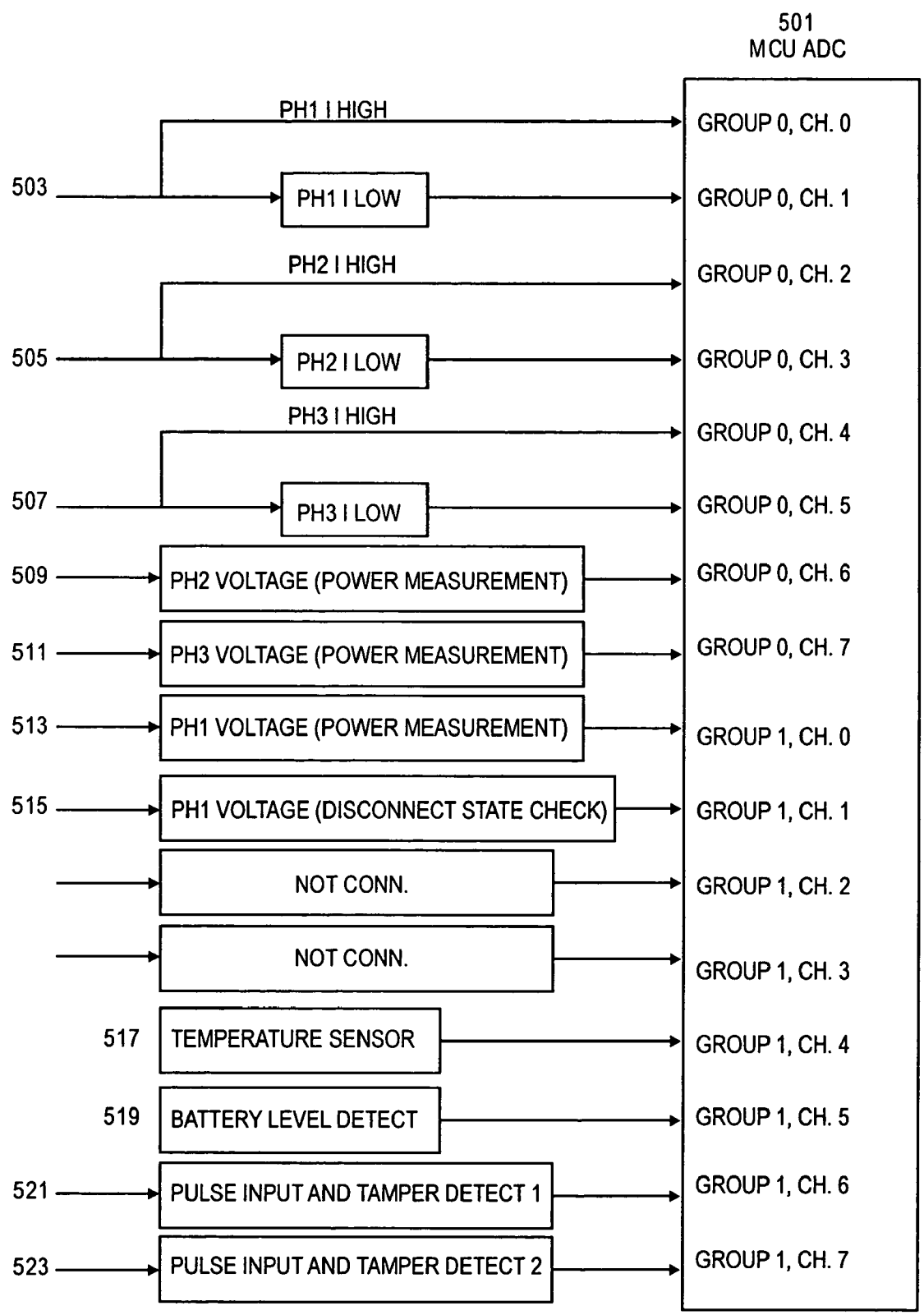
FIG. 5 illustrates an embodiment of analog transducers in communication with a MCU.

Turning now to FIG. 5, an embodiment of analog transducers in communication with a MCU is depicted. In this embodiment there are six current inputs (sensors) 503, 505, 507 acquired by the MCU 501. Three voltage inputs (sensors) 509, 511, 513 for power measurement are also acquired by the MCU 501. Another voltage input (sensor) 515 is used acquired by the MCU 501 and used to determine a disconnect state. There are also inputs (sensors) for temperature 517, battery level 519, and pulse input and tamper detect 521, 523.

Figure 6:
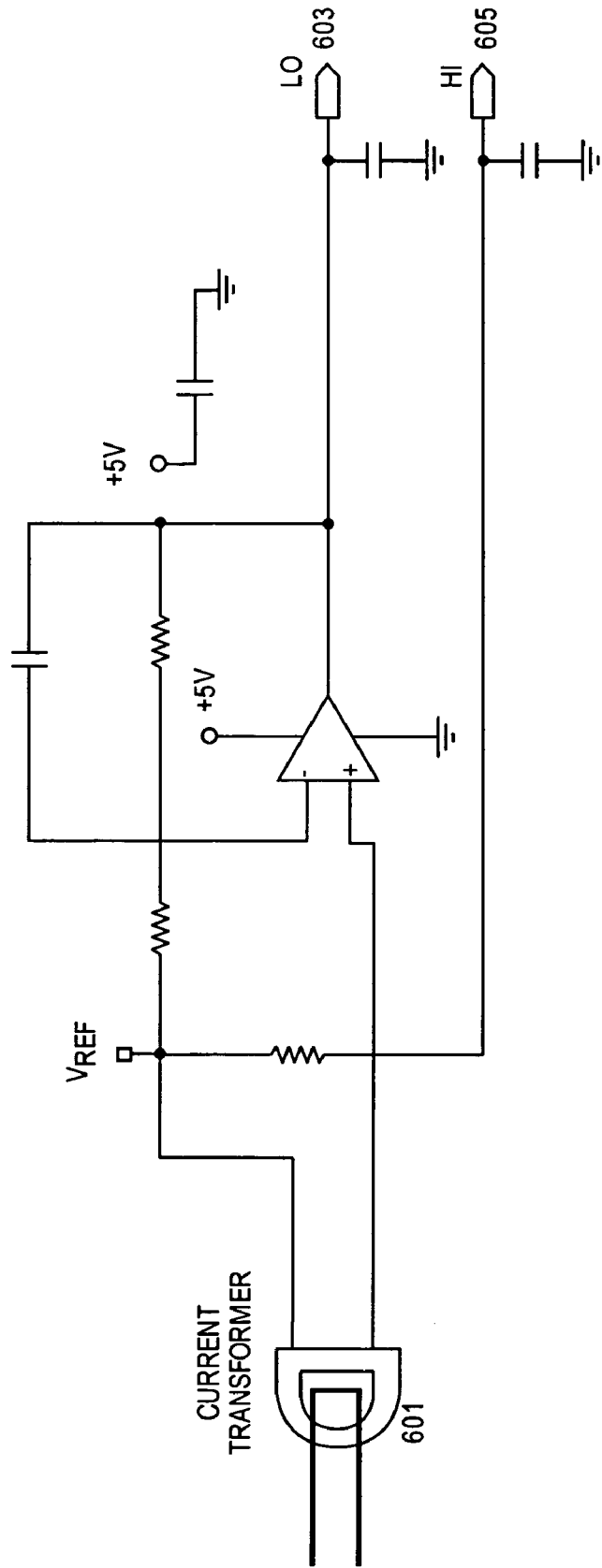
FIG. 6 illustrates an embodiment of a current sensor.

FIG. 6 depicts a detailed embodiment of a current sensor. Three current transformers (CTs) 601 provide proportional analog voltage signals to the MCU. Conditioning circuits split the signals into two ranges 603, 605 for improved gain and resolution. A standard 100 Ampere or 120 Ampere CT 601 can be used in this application. In an embodiment a smaller 5 A CT 601 is mounted directly to the PCB or in the meter case. A CT 601 is supplied through a current divider with a ratio of Maximum current (A): 5 A, specifically designed to accurately handle high currents in excess of 120 A while maintaining the low temperature coefficients required for Class 1 accuracy measurements, termed Bypass CT Technology. The high range current signal (2.5 A or higher) for each phase is fed directly from the CT 601 which is referenced to 2.5V DC into the MCU. Termed Direct CT technology, this approach eliminates the need for extra conditioning circuits but requires significant compensation during calibration to eliminate the non-linearities associated with maximizing the full dynamic range of the CT. A single-ended amplifier circuit with a gain of 43 provides the low range signal (2.5 A or lower) for each phase to the MCU, this range is also referenced to 2.5V. Each range is designed to provide maximum output voltage swing at the ADC inputs, 4V for both the high range and low range, about 20% headroom is allowed for amplifier offsets, reference and gain tolerances. Of course voltages used in this description are solely meant to help explain the invention and in no way is the invention limited to these exact voltages.

Figure 7:
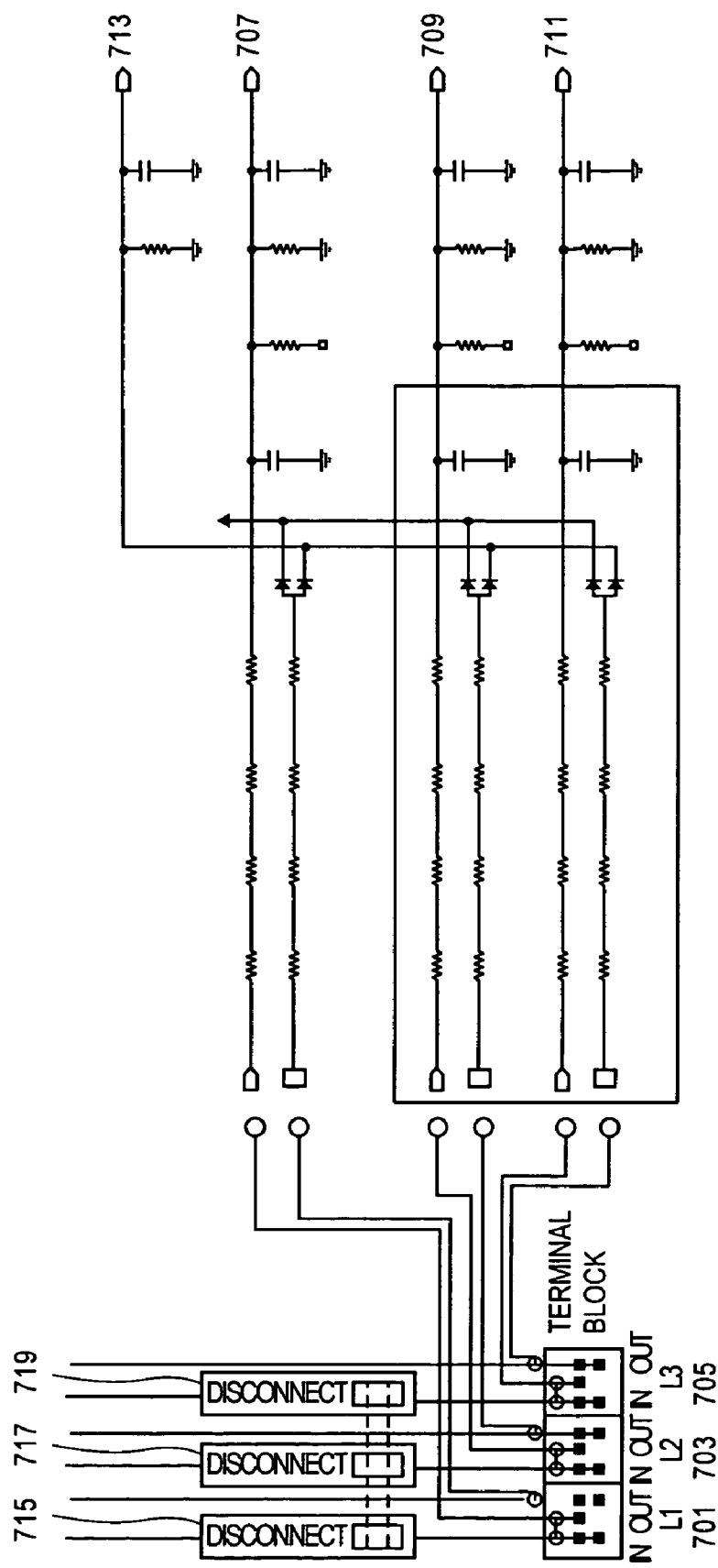
FIG. 7 illustrates an embodiment of voltage sensors.

Turning now to FIG. 7, an embodiment of voltage sensors is depicted. Three resistive potential dividers connected to the line inputs 701, 703, 705 of the meter provide analog proportional signals for each phase. The signals are fed directly into the MCU 707, 709, 711. In one embodiment, the signal amplitudes are designed to provide a voltage swing of 5V at approximately 300V AC. Voltages above this are clamped by the high impedance action of the divider. A set of secondary measurement dividers connected to the output of the main disconnect relays 715, 717, 719 allows determination of the relay status in real-time. The three dividers are summed into one signal 713 and fed into the MCU. The output amplitude is designed to provide a 5V swing at 100V AC. The detection threshold is firmware configured for 80V AC (40V AC for a bi-phase configuration). Of course voltages used in this description are solely meant to help explain the invention and in no way is the invention limited to these exact voltages.

In one embodiment a temperature to voltage converter provides a linear output voltage proportional to local temperature from −40 C. to +125 C. This is fed directly into the MCU. An exemplary temperature to voltage converter is Microchip Corporation's SOT23 TC1046VNBTR. It should be understood that any equivalent temperature to voltage converter can be used. Any temperature measurement offset is calibrated out during manufacturing.

Figure 8:
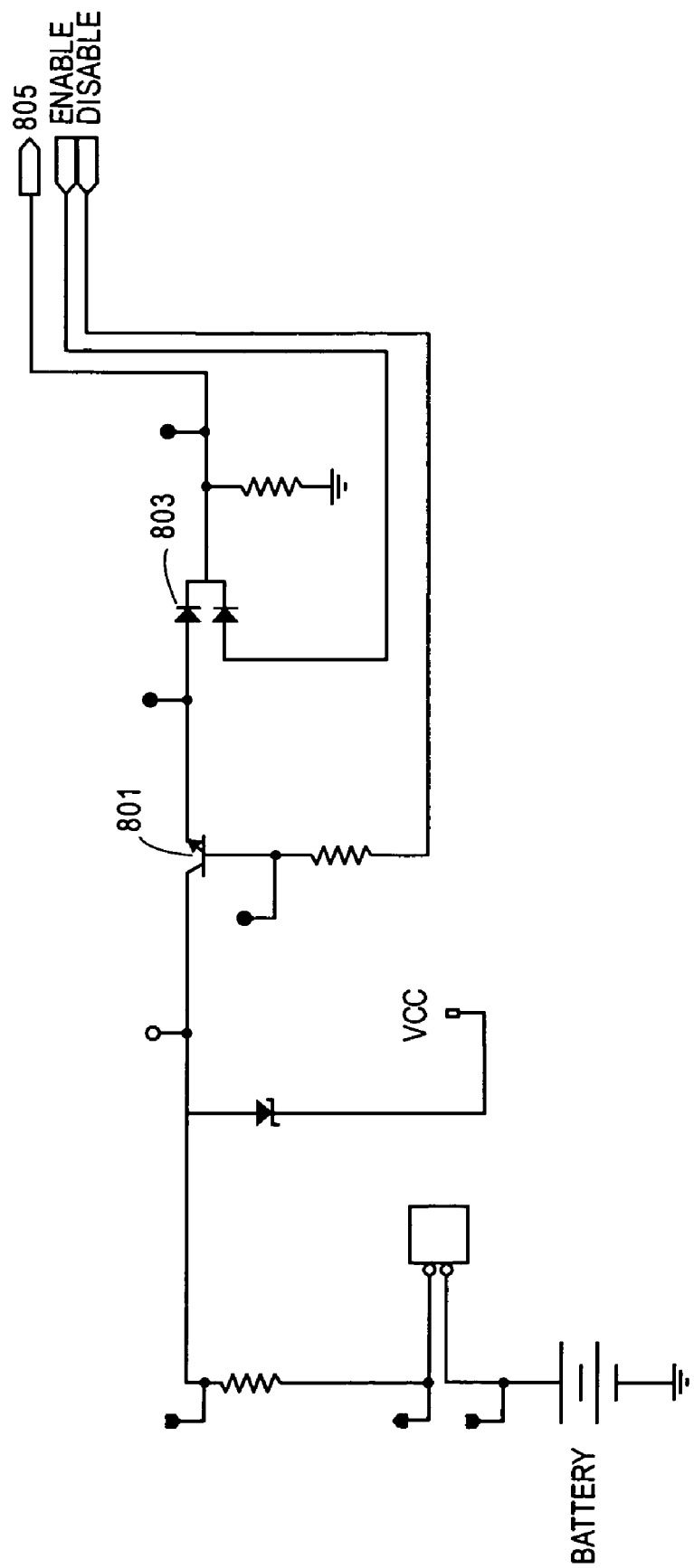
FIG. 8 illustrates an embodiment of a battery level detect circuit.

An embodiment of the meter also includes battery management circuitry 309. Turning now to FIG. 8, an embodiment of a battery level detect (measurement) circuit is depicted. The analog battery voltage level 805 is monitored by the MCU using the measurement engine. In order to accurately determine the battery voltage level under load conditions associated with wake up and timer processing, a substitute load is switched into the battery circuit during measurement. Both the measurement circuit and substitute load are disabled during normal operation in order to conserve power. A signal from the MCU controls a transistor 801 used to switch the battery voltage. It is important that diode 803 has a very low leakage current to prevent over charging of the battery. This circuit completely eliminates battery loss during normal operation. The voltage loss across transistor 801 and diode 803 is compensated for by firmware during the measurement period. The firmware compares this value with a low battery threshold to determine the correct operation for the MCU watch and stop modes during power outages.

As the battery 323 plays a vital role in maintaining some MCU functionality when the main power supply is off, battery management is crucial. In one embodiment, the battery measurement circuit is enabled for less than 15 ms in a 24 hour period during normal operation and every 5 minutes during battery backup to help conserve power over the life of the product. The battery 323 is always monitored on power up. Proper battery management, such as preventing overcharging, monitoring battery voltage level, and adjusting MCU and measurement engine settings, can lead to a battery life of greater than fifteen years.

Tamper management is important for any metering application. In one embodiment, a tamper management circuit 311 communicates with the MCU. A tamper sensor is activated when the meter cover is removed. The sensor could be as simple as a single switch that when opened or closed sends a signal to the MCU indicating tampering. The tamper management circuit 311 is also powered from an internal battery 323 to ensure that tamper management is still performed during a power outage.

Figure 9:
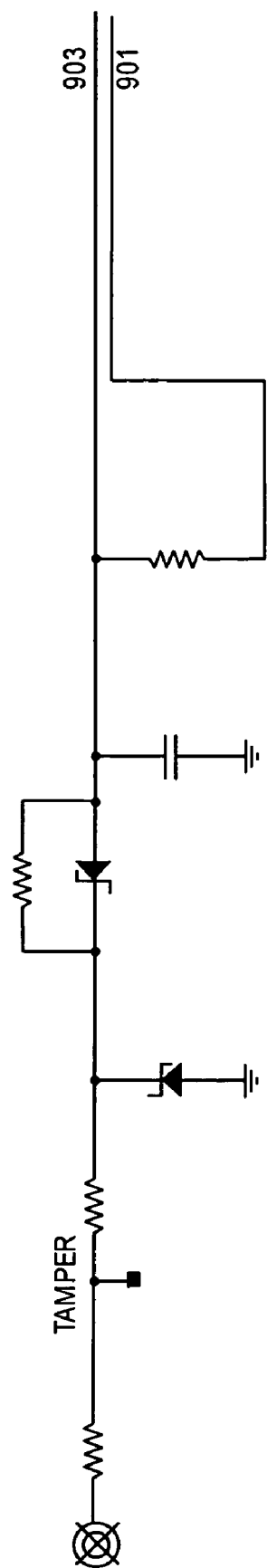
FIG. 9 illustrates an embodiment of a tamper management circuit.

FIG. 9 depicts an embodiment of a tamper management circuit (sensor). This tamper sensor is a simple switch activated when the meter terminal cover is fixed in place after installation of the meter. When the switch is open the tamper signal is pulled high, when the switch is closed the tamper signal is pulled low. Of course a circuit that pulls low for open and high for closed could also be used. A tamper condition must also be detected during battery operation and therefore a low power solution is also required. In one embodiment a simple high impedance sense circuit (6 MOhm) would suffice. In another embodiment a low impedance circuit is used and is poled periodically. In an embodiment this polling is done every second to coincide with watch mode timer functions. However, watch mode timer functions are re-programmable so this polling frequency can be altered. The action of polling is controlled by setting enabling the circuit 901 high and monitoring the output 903. Additionally, resistors and diodes of the circuit serve to protect the tamper detect inputs from external voltage transients which can appear at the line input terminals, such as those created by local lightening strikes.

Figure 10:
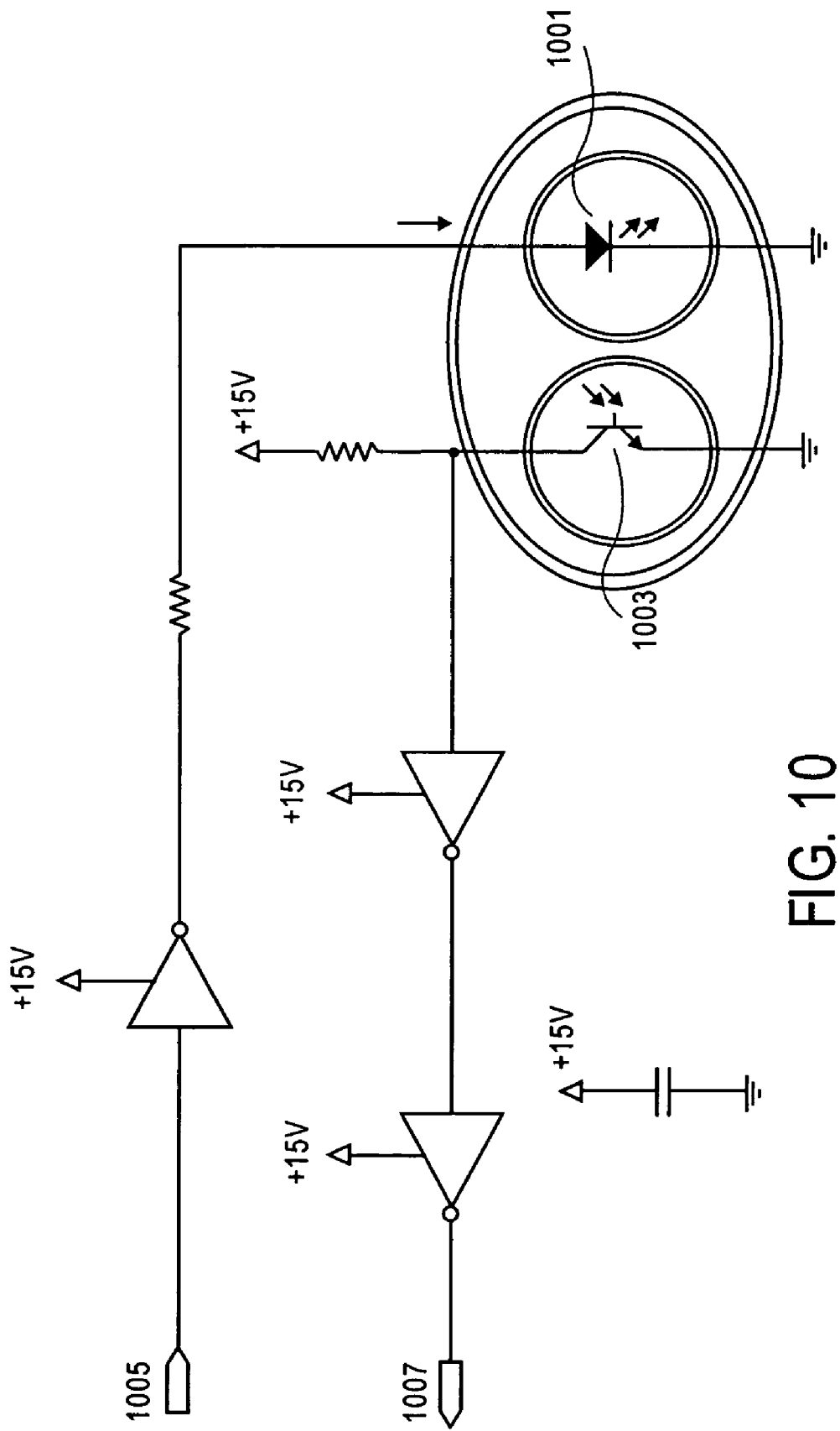
FIG. 10 illustrates an embodiment of an IEC 1107 optical port.

A communication device 313 provides communication capability for the meter. As depicted in FIG. 2, an optical interface 217 can be used to provide communication capability with the meter and an external service tool. In an embodiment this optical interface is provided for by an infrared optical port which is mechanically based on the IEC1107 standard. The data transfer protocol is based on the ANSI C12.18 standard. This protocol offers several services, including full/partial table read, full/partial table write, negotiation of the baud rate, and programmable login session timeout. Security features built in to the protocol include logon, logoff, terminate, and password requests. The default baud rate of the optical port is 9600, but the meter may be configured to support higher rates. All information contained in the meter tables can be accessed, with appropriate security clearance, through the optical port. This channel is intended to be the primary interface for in-house meter calibration, final configuration, and service tool provisioning prior to installation. This port also provides two-way half duplex communications capability to be utilized for calibration and test purposes during manufacturing and provisioning of the meter at the utility's service depot. An embodiment of an IEC1107 optical port is depicted in FIG. 10. This port provides two-way half duplex communications (transmit 1001, 1005 and receive 1003, 1007) capability to be utilized for calibration and test purposes, during manufacturing and provisioning of the meter at the utility's service depot. It can also provide many of the functions of the PLC interface and reinforces the meter's stand-alone capability. The hardware utilizes logical invertors as comparators and level converters to improve sensitivity and waveform symmetry during high speed communications.

An embodiment of the meter includes a latching relay 315 in communication with the MCU to disconnect the line outputs from the meter. This relay 315 is capable of switching loads up to 100 Amperes. The relay can be controlled by the meter using an external actuator electronically sensed or controlled directly from MCU 301 signals. Optionally, the relay can be manually controlled by a user by using a mechanical actuator such as a switch integrated into the cover of the meter.

Figure 11:
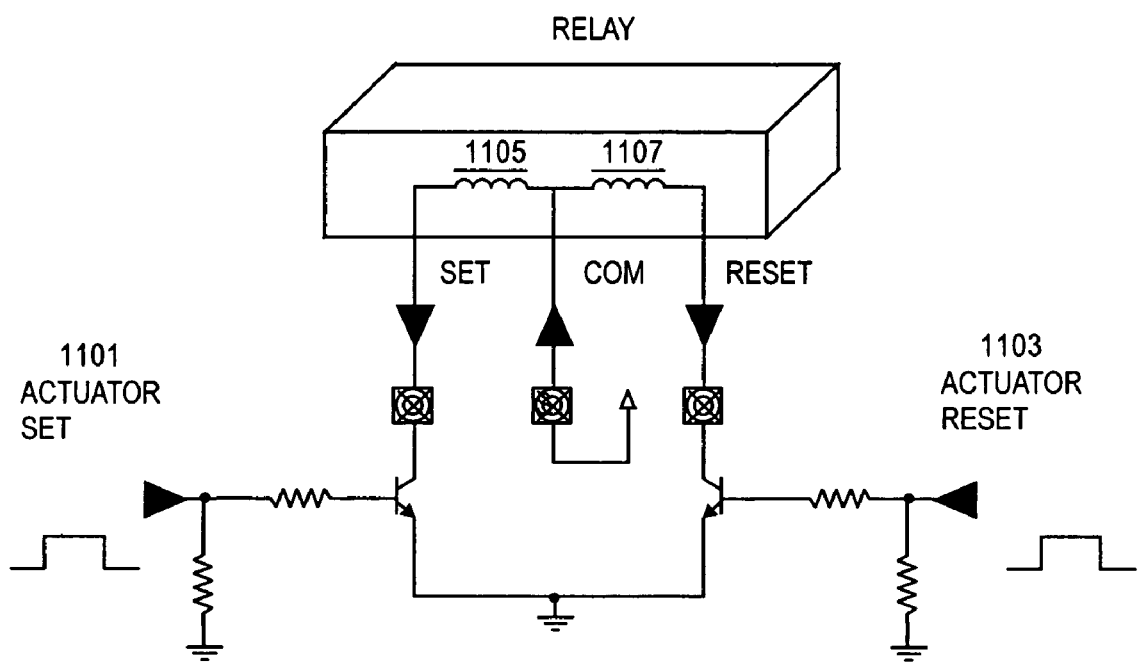
FIG. 11 illustrates another embodiment of an electronically controlled latching relay.

An embodiment of an electronically controlled latching relay is depicted in FIG. 11. The relay, which is capable of switching loads of up to 100 A, can be either manually operated by the consumer or electronically controlled using set 1101 and reset 1103 commands by the MCU 301. A 200 ms minimum pulse is need to energized the set or reset coil 1105, 1107. Each coil has 30 ohm impedance. The peak current will be 400 mA for that short duration. For 3-phase configuration, three relays will be used and power consumption could be as high as 1.2 A for a short duration. Through a combination of control commands and switch position feedback the consumer will only be able to re-connect power in the event that they have authorization from the MCU. This allows the MCU to override manual operation in cases where pre-payment or maximum power is enabled. As part of the management process the status of the relay can be independently established and indicated on the LCD using Vrms measurements taken at the output of the relay by the measurement engine.

Figure 12:
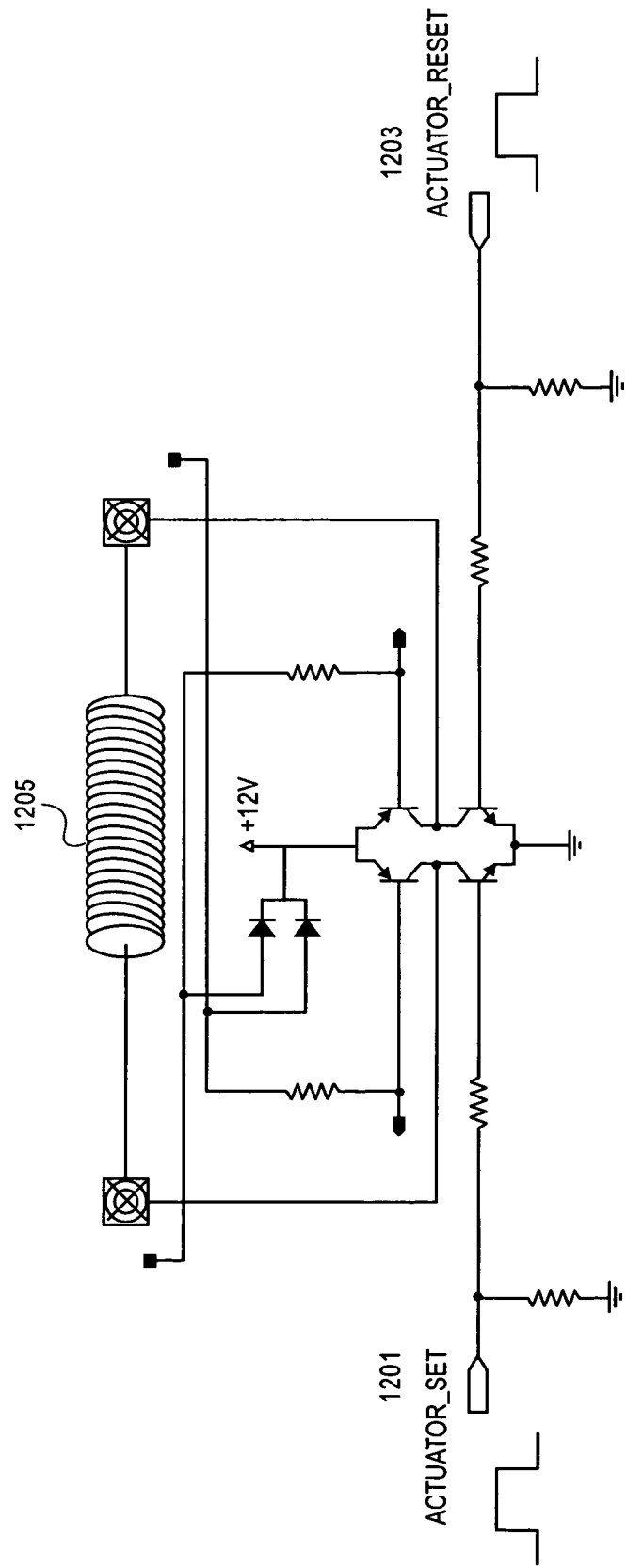
FIG. 12 illustrates an embodiment of an electronically controlled latching relay.

Another embodiment of an electronically controlled latching relay is depicted in FIG. 12. The relay which is capable of switching loads of up to 120 Amperes can be controlled using an external actuator which is electronically sensed or directly from MCU commands generated either from pre-programmed events or by remote command from the head end system. The relay is switched using a high power h-bridge driver. The set control line 1201 closes the relay and the reset control line 1203 opens it. The control lines must be pulsed high for a predetermined amount of time to ensure that the relay switches over correctly. In an embodiment that period is at least 200 ms. However, pulses must not be left on for extended periods due to the high current consumption of the switching coils 1205. In a poly-phase configuration that uses three ganged relays, only two coils are required to be driven. The third relay is mechanically activated by the other two. The consumer can manually control the relay using a mechanical actuator integrated into the cover of the meter. In one embodiment, the position of the actuator is sensed using a long travel micro-switch, the actuator can be configured for the MCU to open the relay when pressed up and close the relay when pressed down or close the relay when the actuator is pressed up and open the relay when pressed down. In order to prevent rapid switching of the relay, which may cause damage to the meter power supply, the manual commands are restricted to a set number over a period of time. In one embodiment this is one switch per second. It is also important to note that the MCU can only close the relay when the command is requested from the manual actuator, this prevents safety concerns with remote switching.

In one embodiment the MCU 301 communicates with a display device 317. Using the display 317, the meter can display information including but not limited to: active energy, reactive energy, prepay credit, line voltage, line wiring configuration, meter date, meter time, reactive power, active power, disconnect status, relay status, PLC communication indication, and tamper indication. In one embodiment the display 317 is a liquid crystal display (LCD). However, those in the art will appreciate that other technologies can be used such as organic light emitting diode (OLED), LED, and light emitting plastic (plastic TFT) can be used.

Figure 13:
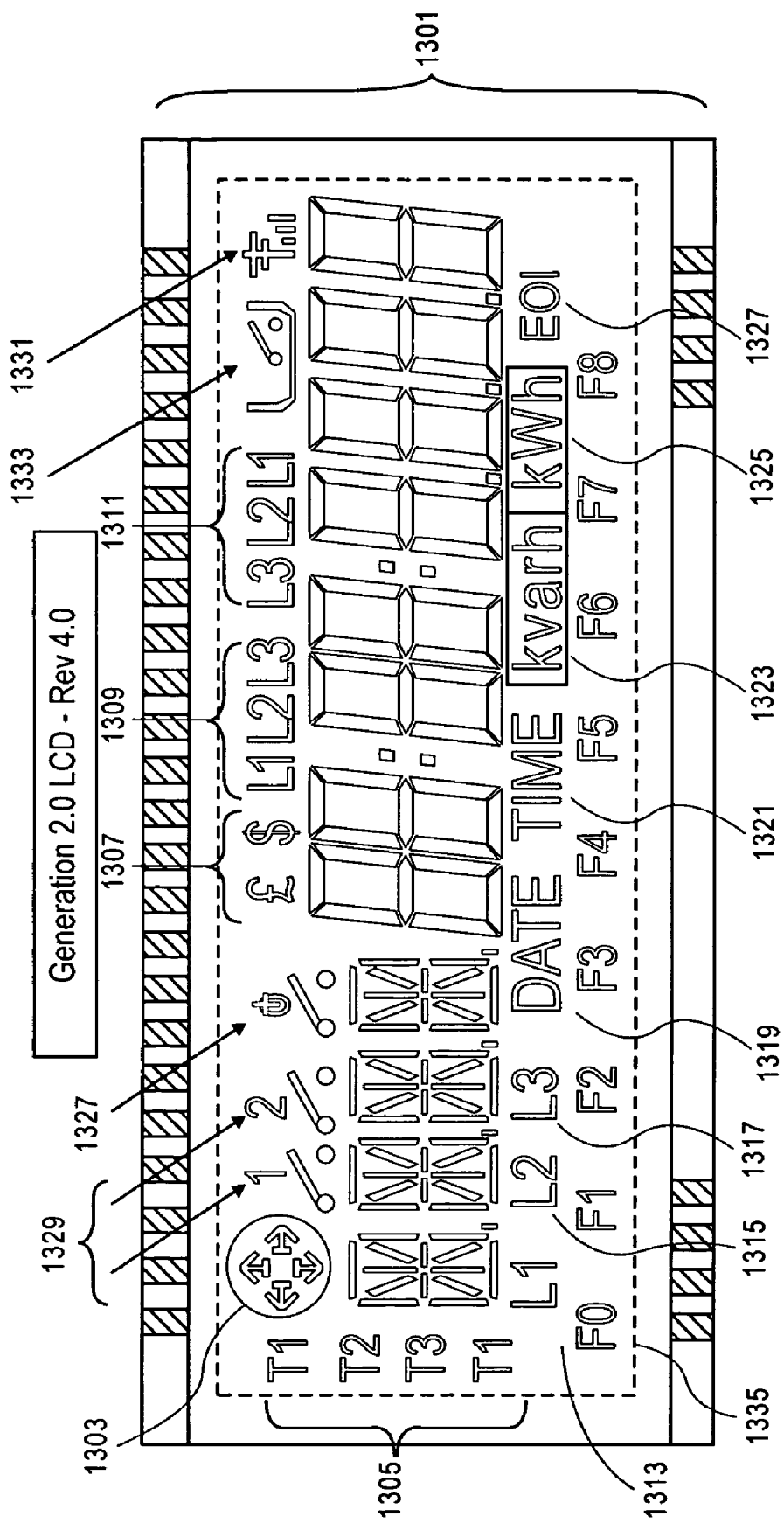
FIG. 13 illustrates an embodiment of a meter display.

An exemplary embodiment of a display is depicted in FIG. 13. Active and reactive energy 1303 can be displayed as forward active energy 1303a, reverse active energy 1303b, import reactive energy 1303c, export reactive energy 1303d. The present tariff operating period 1305 is displayed. The display can also show the energy value 1307 of prepay credit. When three phases are wired in the order of L1->L2->L3 (if the meter is a three phase device), L1L2L3 1309 will be displayed. Conversely, L3L2L1 1311 will be shown if the three phases are wired in the order of L3->L2->L1. If the display shows a different order than expected, it indicates that the wiring might be incorrect. L1 1313, L2 1315, and L3 1317 indicate the presence of voltage on each line respectively. Reactive power and accumulated reactive energy 1323 and active power and accumulated active energy 1325 are also displayable. Disconnect status 1327 and relay status 1329 can be displayed. If there has been a successful PLC communication 1331 it will be displayed. F0 . . . F8 1335 indicated the presently active features on the name plate. If there has been tampering 1333 the display will indicate that occurrence. Also the display can show the firmware version number, F9 to indicate errors in self-read data, and current TOU calendar ID.

In an embodiment the meter supplies a S0 pulse output 319 as a real-time indication of active energy. This output should be in accordance with the DIN 43864-1986/IEC 62053-31-1998 standards. The S0 pulse output 319 can be used to check the accuracy of kWh (kilowatt hour) measurements or coupled to a data logger to provide load profile information. Optionally, the pulse rate and width of the S0 output 319 are fully configurable.

Figure 14:
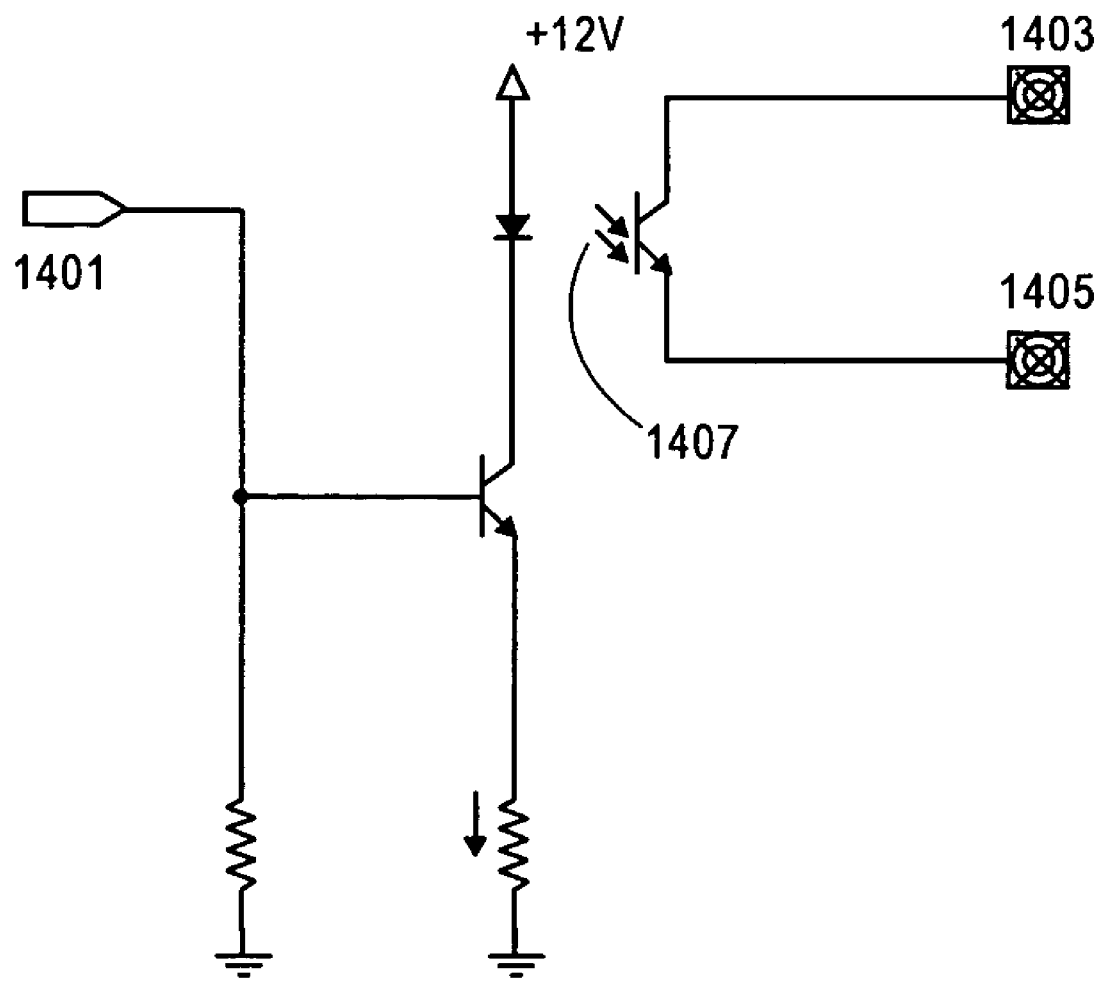
FIG. 14 illustrates an embodiment of S0 pulse output.

An embodiment of a S0 pulse output is depicted in FIG. 14. The interface to the meter is via a fully isolated opto-coupler 1407 designed in accordance with DIN 43864-1986/IEC 62053-31-1998 standards. The opto-coupler 1407 pulse rate and pulse width parameters are configurable within the meter firmware and controlled by the MCU. The S0 output 1401 is made available by two connectors 1403, 1405 in the meter terminal block.

A cold start interrupt circuit 321 can be in communication with a power supply, MCU 301, and a battery 321. This circuit 321 is used to change the mode of operation of the meter from stop or watch to normal mode. The cold start interrupt also helps prevent possible damage to the MCU that could occur by not resetting the MCU on certain state changes.

Figure 15:
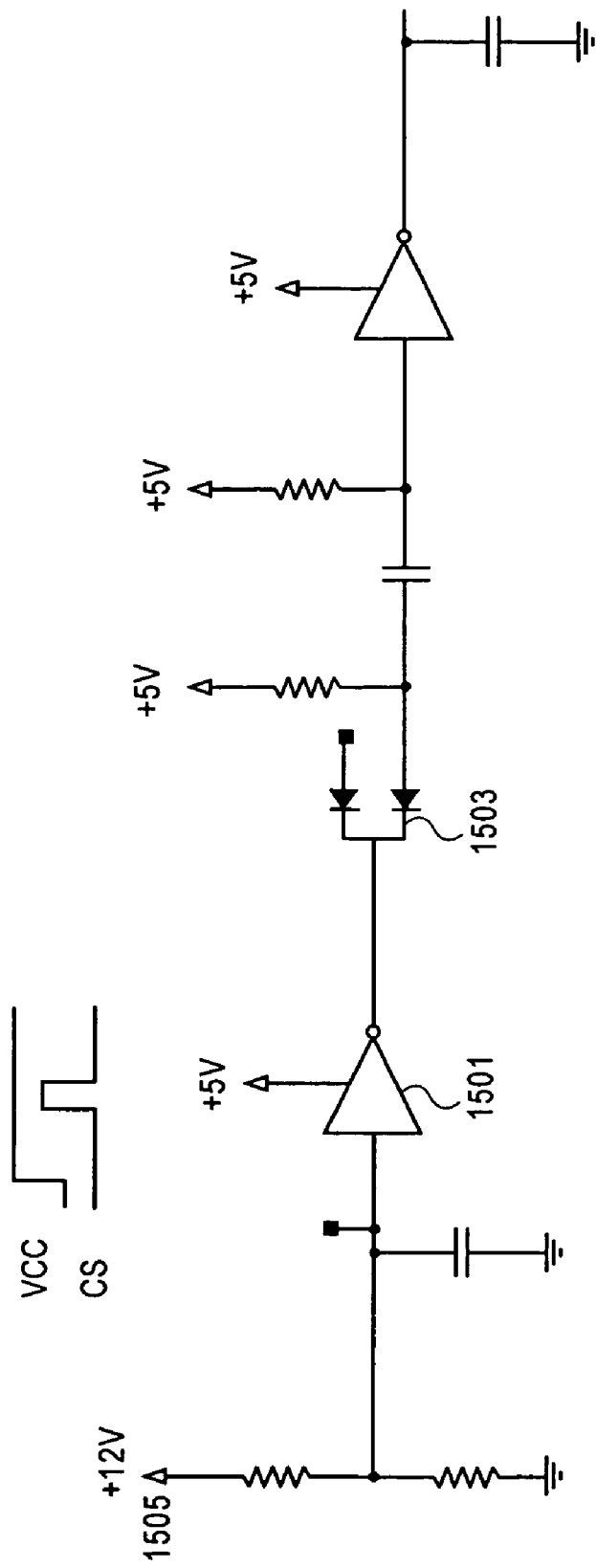
FIG. 15 illustrates an embodiment of a cold start interrupt circuit.

An exemplary embodiment of a cold start (CS) interrupt circuit is depicted in FIG. 15. The CS interrupt is configured to execute on a negative edge. The CS signal is primarily generated from a power supply 1505. The first stage of generation utilizes an inverter 1501 as a comparator, as the +12V rail exceeds +10V on start-up the inverter changes logic state from High to Low, this triggers the second stage differentiator 1503 which generates a pulse on the CS input. This circuit design incorporates several mechanisms to prevent false CS triggers. One mechanism used is to delay the first stage trigger such that the switching threshold can only be exceeded if the +12V rail has ramped above +10V for at least a set period of time. Another mechanism to prevent false triggers on the second stage when the +5V rail is ramping uses a diode to bias the differentiator input, ensuring that CS can only be issued when the +5V supply is above 2V. A power on reset (POR) function is provided by enabling the internal comparator threshold when the battery voltage drops below a safe working voltage for the MCU. In this case the reset is forced by the comparator and will remain in that state until the +5V rail exceeds the voltage threshold. The MCU can, however, independently reset both the LCD controller and the transceiver unit. Both devices are reset periodically in the event that a failure is detected through the peripheral interfaces.

Optionally, latching relays, which are capable of switching current loads, can be in communication with the MCU. The relays are controlled directly by the MCU, each relay can be opened and closed by pulsing pins of the MCU. The voltage free contacts of each relay are made available by two connectors located in the meters terminal block. The state of each relay is re-enforced periodically to ensure correct operation. Typically the relays are used in conjunction with an external contactor for load regulation.

Figure 16:
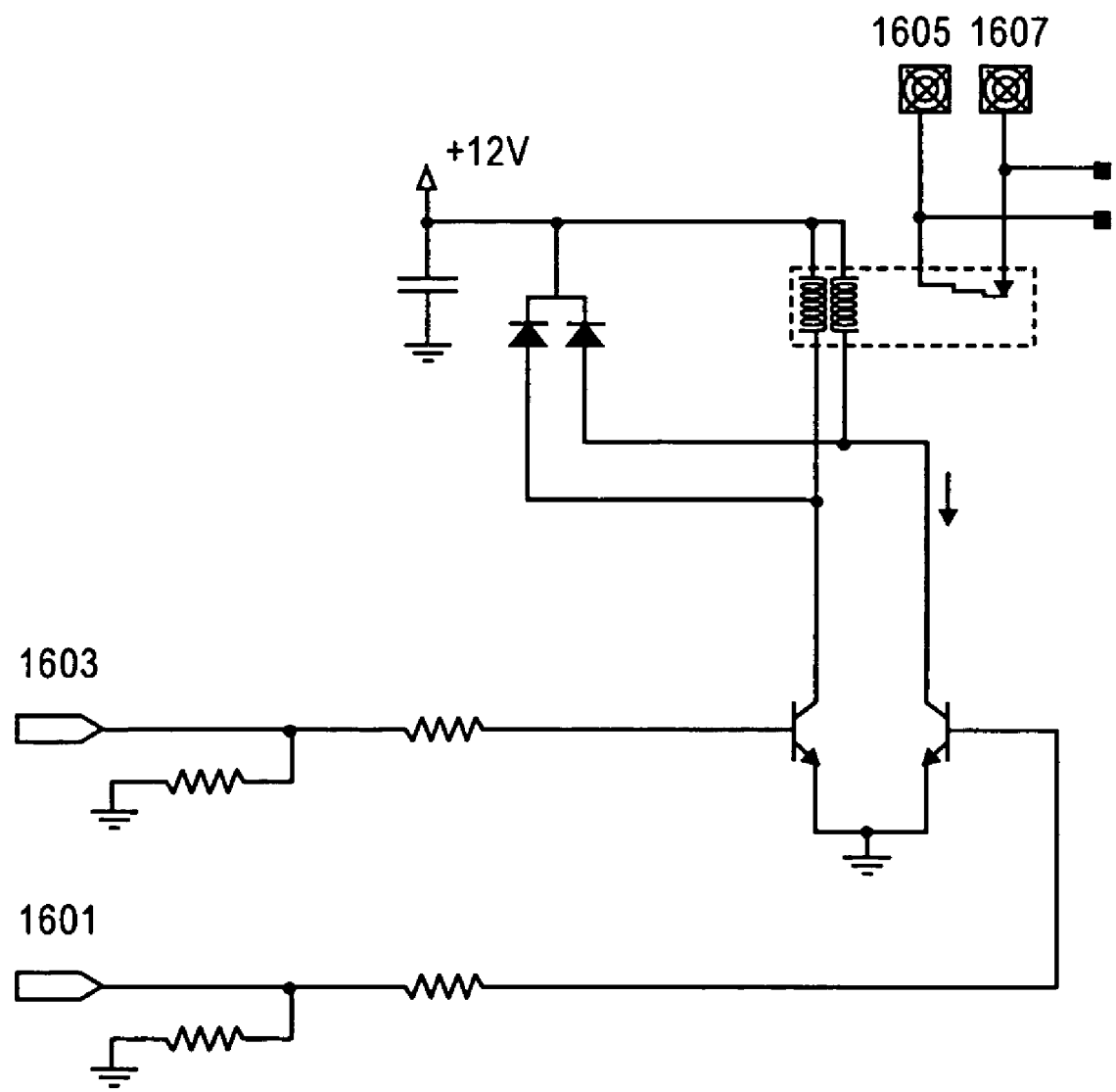
FIG. 16 illustrates an embodiment of a latching relay.

Two latching relays which are capable of switching 5 A loads at 240V AC can be in the meter. The relays are controlled directly by the MCU. In one embodiment of a relay circuit depicted in FIG. 16, a relay can be opened by pulsing high 1601 for a set period of time and closed by pulsing low 1603 for a set period of time. In one embodiment, the set period of time for both is a minimum of 50 ms. The voltage free contacts of each relay are made available by two connectors 1605, 1607 located in the meter's terminal block.

In one embodiment, input and output to the meter is provided through an input/output (I/O) port 325. This port 325 allows for programming and for testing of the meter. Exemplary ports include but are not limited to USB connection, RS232, Ethernet, and the IEEE 1394 standard.

Figure 17:
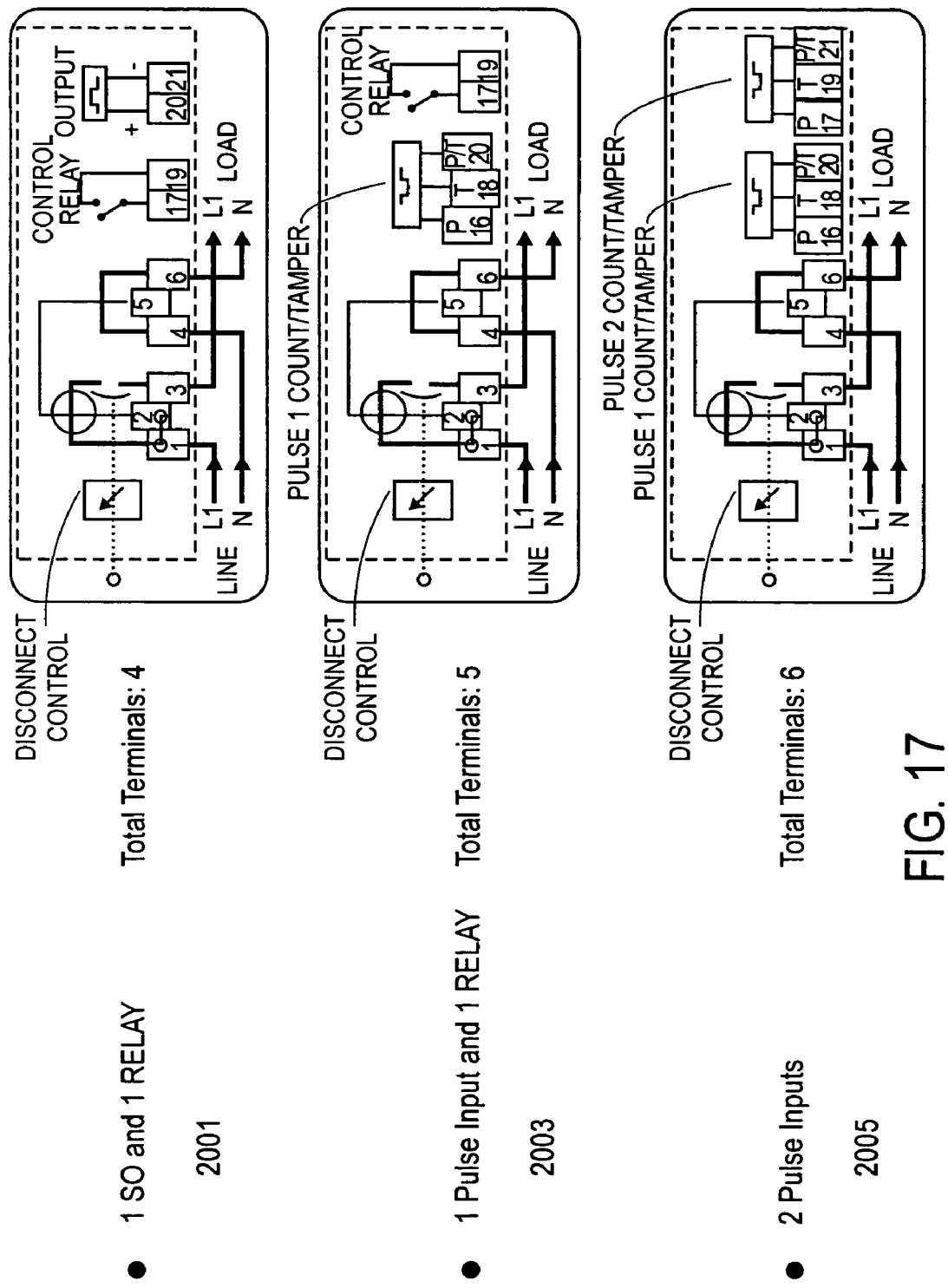
FIG. 17 illustrates configurations for six auxiliary terminals that are provided through a terminal block in an embodiment.

In one embodiment the meter case and terminal blocks have been designed to meet a combination of European DIN (80 A) and BS (100 A) standards. With both topologies there are a total of four high-current input/output terminals and one isolated voltage input terminal required during calibration. A traditional link has been used to allow for isolation of the current and voltage circuits. The single line voltage terminal and a similar neutral connector are made available for the remote powering of ancillary devices located next to the meter when installed. All terminals are manufactured to withstand harsh environmental conditions. The current input terminals, current transformers and internal current conductors are all manufactured as one sub-assembly along with the 100 A disconnect relay. The configuration is such that it allows the load to be disconnected while maintaining a voltage supply to the meter. The relay itself can be manually opened or closed using an actuator integrated into the meter cover. Six auxiliary terminals are provided through the terminal block. They provide connections to the user interfaces and come as configurable options as depicted in FIG. 17. These configurations are one S0 and one relay 1701, one pulse input (dry connect/voltage free) device and one relay 1703, and two pulse input (dry connect/voltage free) devices 1705.

Figure 18:
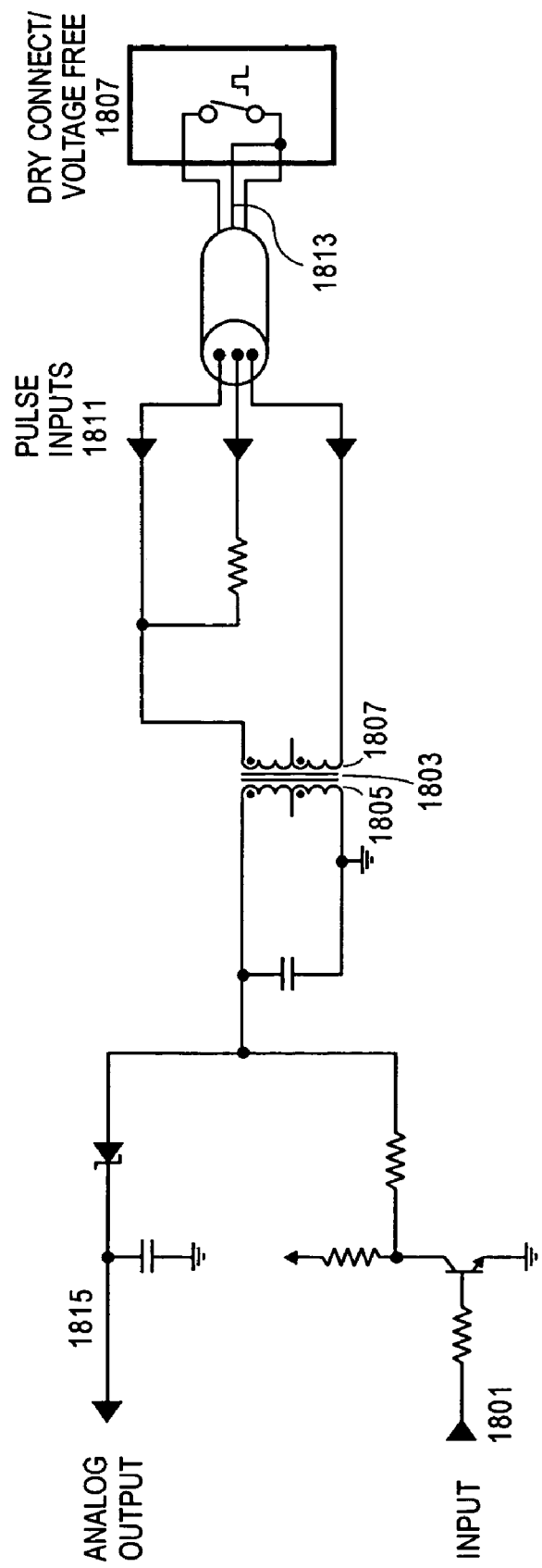
FIG. 18 illustrates an embodiment of a pulse input and tamper management circuit.

FIG. 18 depicts an exemplary embodiment of a circuit for connecting gas or water meters 1807 and other dry connect/voltage free devices can be connected to the meter using pulse inputs 1811. A pulse width modulated (PWM) signal 1801 is sent from the MCU to primary 1805 of a transformer 1803. In one embodiment this transformer is a small form factor switching transformer commonly used for isolated power supplies. The secondary 1807 is attached to the pulse input device through an isolation circuit. The secondary 1807 of the transformer transfers the impulse to the pulse device 1807 which is connected directly to the gas or water meter. By sensing the amplitude of the current in the primary of the transformer we can determine the input impedance of the pulse device can be determined. By doing this it can be learned if the dry contacts are open or closed. The pulsed current signal is sensed, integrated, and fed into the MCU for processing.

Additionally, the circuit provides the capability to measure impedance a loop tamper function to determine if the gas or water meter has been disconnected from the meter. To implement the loop tamper function, a load is applied across the secondary of the transformer through a looped wire in the pulse input cable. The current provided by this load is designed to bias the DC output voltage at the MCU to a portion of the voltage maximum (Vmax), if the connecting cable is cut and the loop broken the DC output voltage will rise to Vmax. In one embodiment, the tamper signal is superimposed on top of the pulse signals.

Modes of Meter Operation

Figure 19:
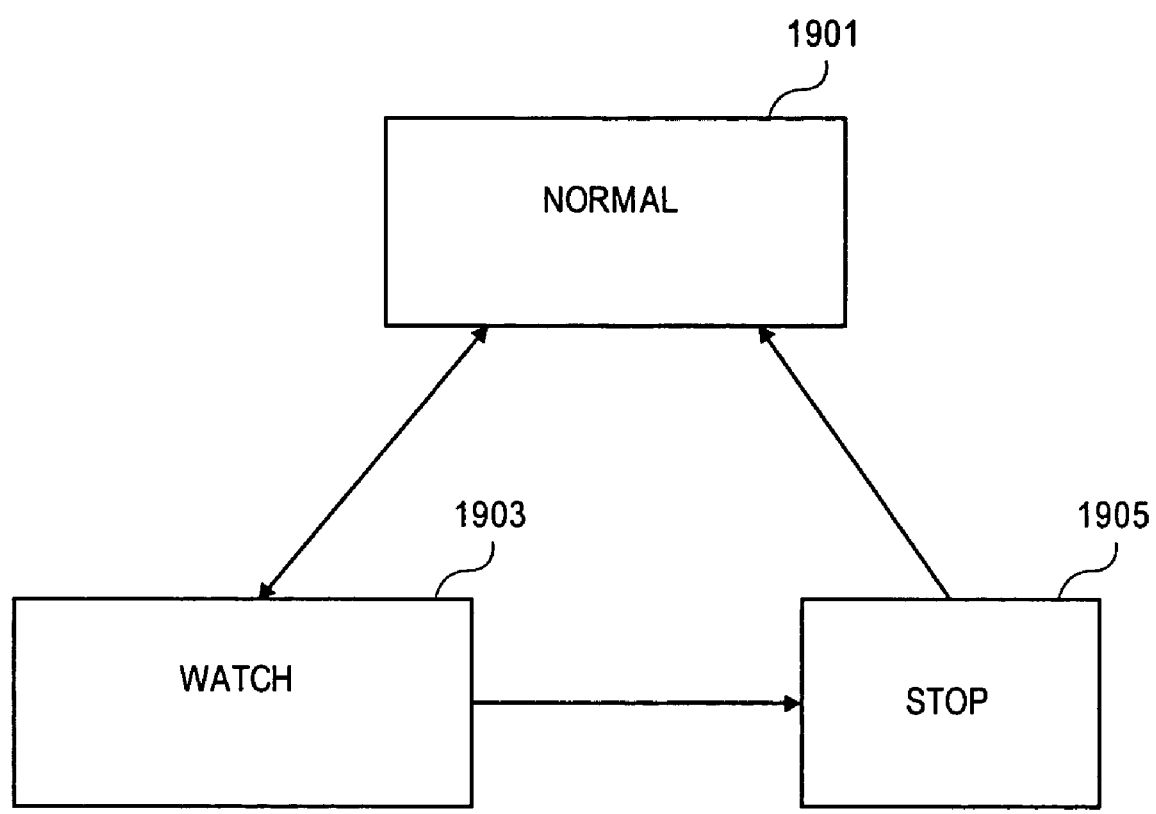
FIG. 19 is a flow chart illustrating the power states of a meter.

FIG. 19 depicts one embodiment of a meter's modes of operation. In normal mode 1901, the MCU and all devices are fully powered by the main power supply and operate at full clock speed. This is the first mode of operation when a meter is first powered on in addition to being the usual operating mode. During this mode analog signals are converted from an array of real time transducers into raw data that can be handled in the digital domain (analog-to-digital conversion (ADC)). This data is processed into metering information including but not limited to active energy, reactive energy, prepay credit, line voltage, line wiring configuration, reactive power, active power, disconnect status, relay status, PLC communication indication, battery level status, and tamper indication. During normal mode a real-time clock (RTC) is also created. In one embodiment, the RTC is created by using a counter. In another embodiment, the MCU uses a crystal to provide a RTC. In still another embodiment, the RTC is provided by using the frequency of the power line (50/60 Hz) to calculate each second.

In watch mode 1903, the MCU is the only active device powered. The power source is a battery and the main power supply is turned off. In watch mode 1903 the MCU enters a state where all the input/output (I/O) is re-configured to support minimal current consumption, and nearly all interrupt sources are disabled. A few of the functions that are run during normal mode 1901 are still run during watch mode 1903. These include but are not limited to creating a RTC, monitoring for tampering, and determining battery level status. Creating a RTC can be done by incrementing a RTC timer. In this mode care must be taken to assure that any watchdog-type timer does not expire and turn off the meter completely. Prior to entering the watch mode 1903 the MCU will have performed a number of pre-power down tasks including saving critical data in memory. In one embodiment, the memory is Ferroelectric Random-Access Memory (FRAM). This critical data will include the current state of the clock/calendar data which will be recovered and adjusted on power restoration. Optionally, a signature will be included in the section as a means of validating it. When power is restored and the main power supply returns the meter will return to normal mode 1901.

In stop mode 1905, all MCU clocks are stopped and the MCU does not execute. A configurable value will control how long the watch mode 1903 will be supported until the MCU enters a stop mode at which point it will either execute the MCU stop mode (turning off all clocks for minimal standby current consumption) or it will set an I/O control that will disconnect the battery backed supply. The MCU can switch directly to stop mode with hardware reset enabled in the event that the battery voltage is low. In this mode watch mode is skipped and from stop mode 1905, a transition to normal mode 1901 can occur. When power is restored the MCU will use internal reset logic to perform a hard or software reset, depending on the entry mode, and return to normal mode. Upon returning to normal mode 1901, the amount of time of the outage is recorded for later reporting to the utility provider.

Figure 20:
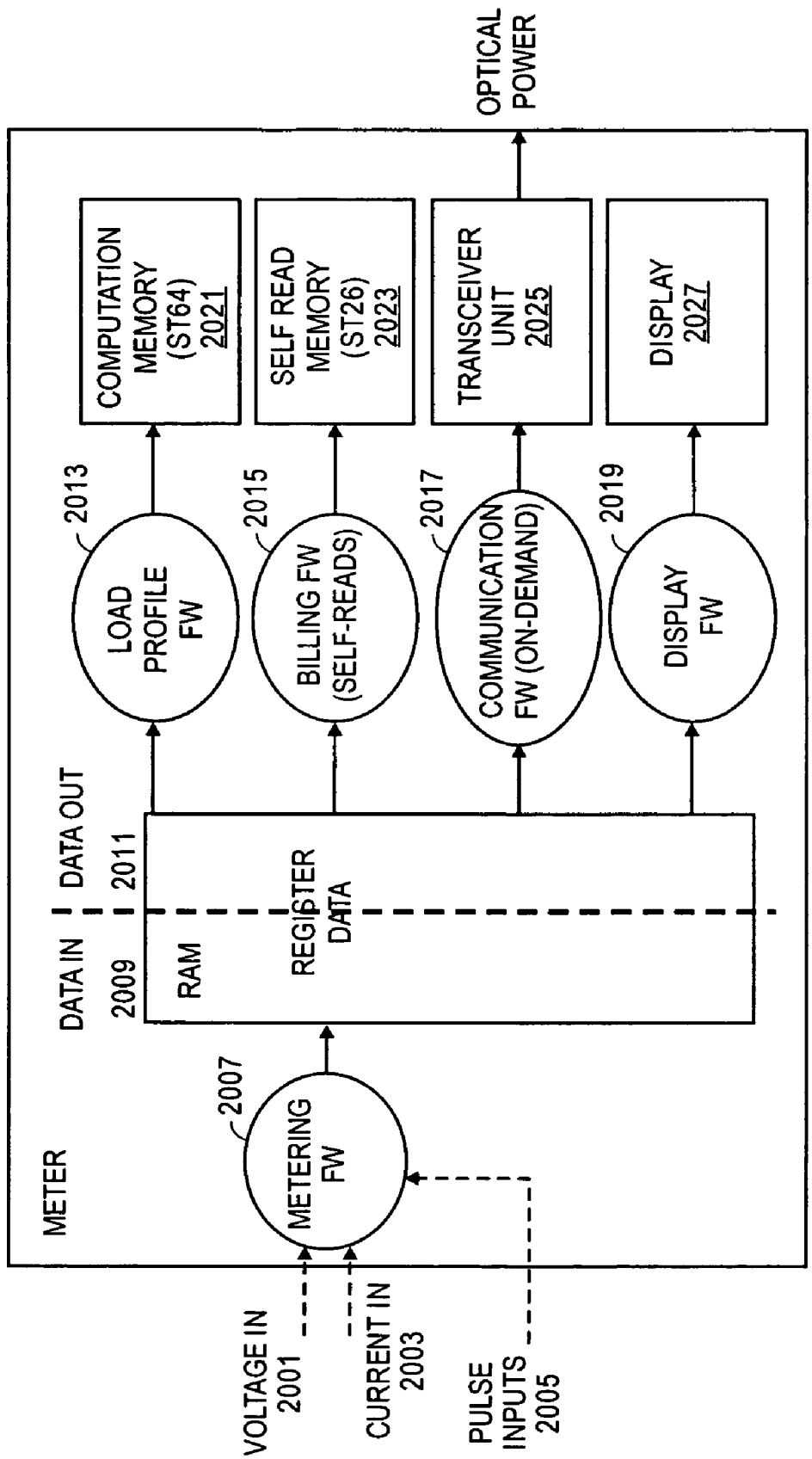
FIG. 20 illustrates an embodiment of overall meter data flow.

Turning now to FIG. 20, an exemplary embodiment of the overall meter data flow is depicted. This diagram shows the direction of consumption data flow and the dependencies on this data across the major software modules that use it. The consumption data of voltage in 2001, current in 2003, and pulse input 2005 is read by the meter 2009 and converted to digital data. This data is temporarily stored in RAM before being processed by appropriate firmware (load profile 2013, billing 2015, communication 2017, and display 2019). After being processed by the appropriate firmware the data is stored in register data tables 2021, 2023, displayed 2027, or transmitted 2025. In one embodiment the following tables are used: standard tables (exemplary uses include but are not limited to general configuration, device identification, procedure initiate, time of use, clock, load profile data, etc.), manufacturer tables (exemplary uses include but are not limited to meter calibration, RTC calibration, pulse inputs, measurement data, daily consumption, billing registers, etc.), standard procedure tables (exemplary uses include but are not limited to set date and time, activate all tables, activate specific tables, clear all tables, clear specific tables, clear alarms, set tariff, etc.), and manufacturer procedure tables used during self-calibration.

The modules needing to use, read, process, and store consumption data (load profile, billing, communications, and display) can then simply pull the data from the register tables whenever needed. If the latency of consumption data updates is not acceptable to the reading modules, this data model collapses as direct data paths between reading and writing modules, bypassing table storage, need to be established. This in turn creates timing dependencies not needed otherwise. Thus, the higher the frequency of metering module updates to the register data, the less the latency in the resultant data read and processed, and the closer to real-time the data appears.

Load profiling is the periodic storage of interval energy measurement. In one embodiment the meter supports several configurations of load profiling. Several channels can be recorded from any of the measurement values, in programmable intervals from 15 minutes up to 1 day. The load profile module controls and maintains the internal scheduled, periodic storage of certain energy summations. Load profiling can be configured to store, for example, snapshots of the active and reactive energy registers every 15 minutes. A large data block is retained in the meter for the load profile records. Load profile can be reconfigured, but not disabled. The data can be ignored or read with no effect on other meter operations. On power up the meter software will determine if load profile records were missed through the power outage and will stuff missing intervals only on the power-off and power-on day. If the outage spans more than one day, the log will reflect a discontinuity of calendar days in two successive blocks. Load profile is configured by indicating the number of channels to be logged, the interval duration, and which channels to log. The structure of the load profile records follows the ANSI C12.19 format. The records are split into logical groups called blocks. One block always represents one calendar day. Certain status information is reported only once per block, including the timestamp and status of complete intervals. Other status information is contained in other tables. For ease of use, all relevant geometry and status information for the present active load profile configuration is also contained in a manufacturer's table.

Figure 21:
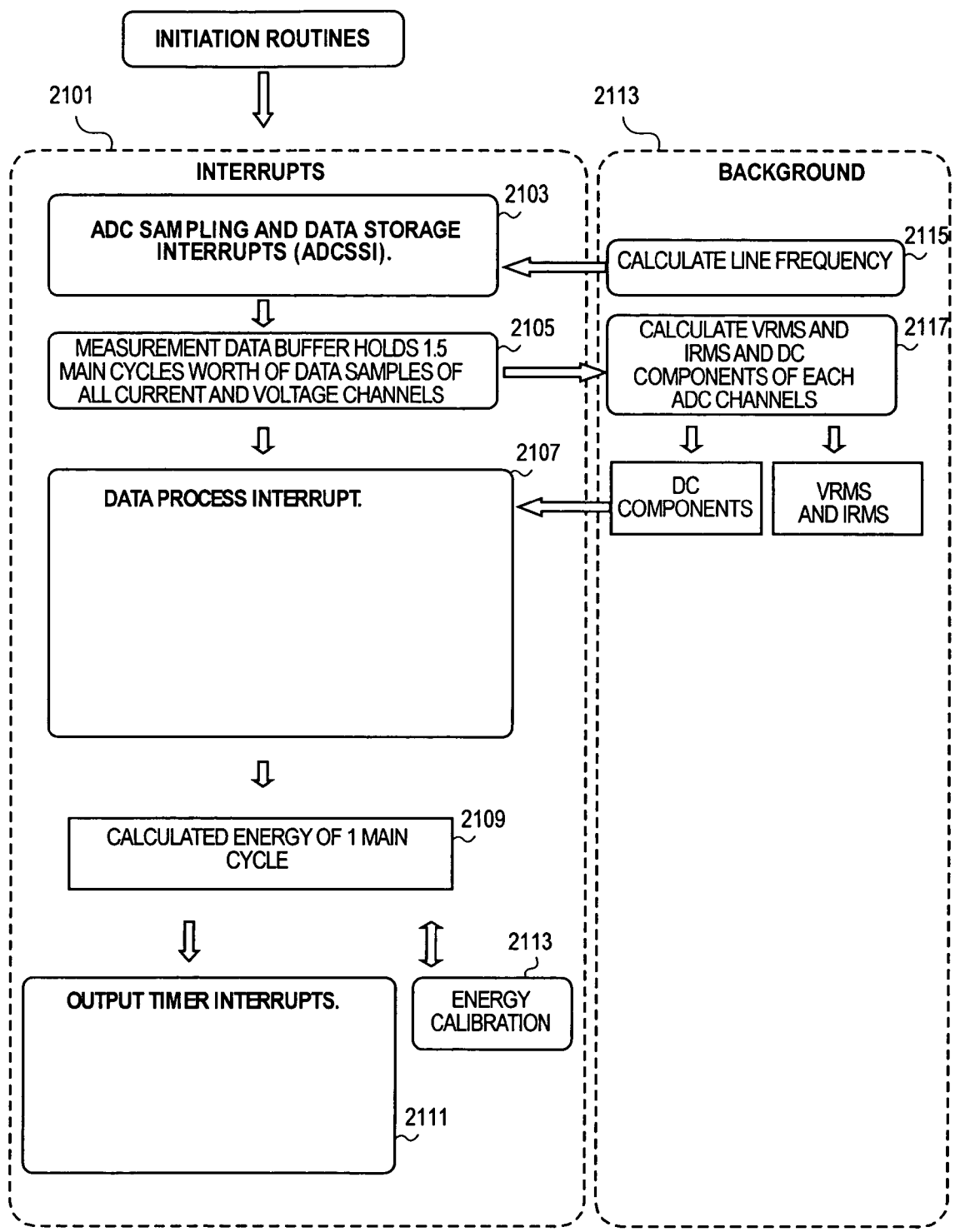
FIG. 21 is a flow chart illustrating an embodiment of a measurement engine of a meter.

FIG. 21 depicts one embodiment of the normal mode operation of a measurement engine of the meter. By way of a non-limiting example a 50 Hz power system will be used to describe this embodiment. With a 50 Hz system a cycle takes place every 20 milliseconds (20 ms) which we call a main cycle. The measurement engine uses a buffer of one and a half cycles worth of samples for each range of phase at any one time. Using a buffer reduces the number of multiplications required for processing samples. The buffer provides for a ninety (90) degree phase shift required for reactive measurements and allows for choice in the number of samples to be used in each calculation. Additionally this allows a choice of either high range or low range data to be selected for measurements on a cycle by cycle basis, depending on a predetermined criteria for qualification.

In one embodiment the meter runs a continuous main program loop to run tasks whenever they are reached. These tasks are selected from the group consisting of but not limited to real-time clock calendar processing, power quality, load profiling, time-of-use scheduling and tier assignment, billing reads, high-level communication processing for both PLC and optical channels, scheduling and operation of control output, total energy (daily consumption), updating the display, self-test, updating data to external memory, and remote firmware download.

Analog inputs to the meter are sampled by the MCU simultaneously at a set rate. In one embodiment that rate is eighty (80) times the line frequency. Sampling is performed using an interrupt driven procedure 2101 and ADC sampling is given high priority. At the above mentioned sampling rate, ADC sampling and data storage interrupts 2103 occur enabling the MCU to sample and store data from the analog inputs. This data is stored in a buffer 2105 that holds one and a half main cycles worth of all current and voltage channels. The measurement engine moves data out of the ADC registers and stores it to memory on every ADC sampling and data storage interrupt 2103. As soon as one main cycle worth of data becomes available in the memory buffer, the measurement engine can begin to process this data into measurands that will be used by the metering and power quality routines.

In one embodiment the ADC sampling and storage interrupt procedure is performed by first enabling an ADC interrupt to enable ADC sampling on a first group of external analog signals by the MCU. Zero cross is detected and a zero cross counter is increased for line frequency calculation. An output is signaled to a PLC system. A second group of external analog signals is sampled. Then a conversion interrupt procedure is invoked that includes enabling the MCU to move the sampled data to a memory buffer and disabling sampling by the MCU. Finally, the sampled data is processed.

After a set number of ADC sampling and data storage interrupts have occurred, a data process interrupt 2107 is generated. In one embodiment of the measurement engine, this interrupt occurs after eighty (80) ADC and data storage interrupts or in other words matching the line frequency. At no point, however, does ADC sampling and storage stop. During the data process interrupt active and reactive energy are calculated. Then the energy of one main cycle is calculated 2109. From this, output timer interrupts 2111 are generated that update energy accumulators for billing, LED, and S0 pulses. Using the value of from the one main cycle energy calculation 2109, active and reactive energy are calibrated 2113.

In another embodiment of the measurement engine, a data process interrupt is generated every quarter of a main cycle. During the data process interrupt the following tasks are performed from the group including but not limited to calculating active and reactive energy, calibrating active and reactive energy, updating accumulators, generating LED pulses, generating S0 pulses, calculating active and reactive power, and power fail detection.

Some tasks can be performed in the background as they are less time critical or time consuming. These include but are not limited to calculating line frequency 2115, calculating Vrms, Irms and DC components of each ADC channel 2117, calculating power factor and sin(phase angle), phase loss detection, low battery detection, calibrating Vrms and Irms, calculating apparent power, and performing temperature compensation. All of these calculations are stored in either a register or some other type of storage device.

In an embodiment, the meter supports a measurement alarm that will be triggered if any one of the following failures happens. The first failure that will trigger the measurement alarm is when no data process interrupt received for five consecutive seconds. This five second time duration is checked in the background and it may not be accurate but that is not important. The second failure that will trigger the measurement alarm is when the calculated DC component for any of the measurement channels is out of range for 10 continuous calculations. The third failure occurs when the gain comparison of instantaneous data values from the high current range buffer and low current range buffer do not match that of the hardware. When the failures described above occur, the measurement alarm located in a table will be set. If the measurement alarm is not previously set, the failures will be logged in the event log with failure type and phase number as argument, and a boot reset will be invoked too. However if the failures happen with measurement alarm already set, they will not be logged in the event log and there will be no boot reset either.

Voltage root mean square (Vrms) for each phase is measured and calculated from the power quality input. These measurements are used for power quality and phase loss detection. Due to the fact that calculating RMS values of phase voltages (Vrms) are time consuming, the calculations will be done in the background. In one embodiment, Vrms will be calculated based on a predetermined number of samples of one main cycle. The following equation shows how the Vrms is calculated:

$$Vrms = \sqrt{\frac{1}{N} \sum_{i=0}^{N-1} Vsample_i^2} * RatioP$$

Where N=number of samples in one period and RatioP=the ratio of the voltage transformer.

To calibrate Vrms, one gain and one offset calibration point is provided for each phase. The mathematic module for calibration can be expressed in the following equation:

Calculated Vrms=Measured Vrms*Vrms Gain+Vrms Offset

Measured Vrms is the Vrms value calculated. The Vrms will be set to 0 if it is lower than a predefined threshold or the phase is configured to be inactive.

Similar to Vrms, Irms for each phase is also calculated in the background and based on predetermined number of samples of one main cycle. The following equation shows how Irms is calculated:

$$Irms = \sqrt{\frac{1}{N} \sum_{i=0}^{N-1} Isample_i^2} * RatioF$$

Where N=number of samples in one period and RatioF=the ratio of the voltage transformer.

One gain and one offset calibration point is provided for each phase. The mathematic module for calibration can be expressed in following equation:

Calculated Irms=Measured Irms*Irms Gain+Irms Offset

Measured Irms is the Irms value calculated. The Irms will be set to 0 if it is lower than a predefined threshold or the phase is configured to be inactive.

Line frequency is calculated using the following equation:

Line Frequency=Num/Period

Num is the number of zero crosses and the Period is the time duration to get the Num of zero crosses. In one embodiment, Num is chosen to be 100, which means the line frequency will be updated every 1 second at 50 Hz.

The measurement engine will only calculate line frequency from one of the active phases even if it is a multiple-phase meter. If the frequency of a phase, from which the line frequency is calculated, falls out of the range of 45 to 65 Hz for five times in a row, line frequency calculation will be shifted to the next active phase.

In one embodiment the measurement engine measures energy on each active phase but only reports the summation of these energies. The energy consumption is indicated by way of LED, S0 output and storage of the values. In an embodiment storage is provided in registers of a table. The meter will calculate active energy and provide four registers in the table for forward, reverse, forward+reverse, and forward−reverse. The meter will calculate reactive energy and provide four registers in the table for import and export. The meter will also calculated reactive energy for all quadrants, but only for debugging purpose, the quadrants include Q1 (import inductive), Q2 (import capacitive), Q3 (export inductive), and Q (export capacitive). Two LEDs will be used for test purposes. The first LED indicates active energy. As soon as the active energy (either forward or reverse) increases by 1 Wh the first LED flashes. Similar to the first LED, the second LED is used to indicate reactive energy. The first LED can also be configured to show reactive energy, but this feature will only be used during manufacturing.

Active energy for every period is calculated in the following manner:

$$Wh = \sum \left( \left( \sum_{i=0}^{N-1} V_i * I_i \right) * RatioP * RatioF \right)$$

Where N=the number of samples per period and RatioP and RatioF are as defined above.

Reactive energy is calculated the same way as active energy but with the voltage channel shifted by 90 degrees. The 90 degrees phase shift is introduced when determining the samples to be processed from the ADC buffer.

$$Varh = \sum \left( \left( \sum_{i=0}^{N-1} V_{i+\frac{N}{4}} * I_i \right) * RatioP * RatioF \right)$$

Where N=the number of samples per period and RatioP and RatioF are as defined above. The calculation of reactive energy is similar to active energy as described above.

The measurement engine will calculate total active power (in watts) of all three phases. No power information for individual phase is provided if more than one phase is present. Power is calculated using the following equation:

W=Wh/Time

The measurement engine will calculate total reactive power (Var) of all three phases. No power information for individual phase is provided if more than one phase is present. Power is calculated using the following equation:

Var=Varh/Time

Apparent (VA) power is calculated as following:

VA=Vrms*Irms

Power Factor (PF) is calculated using the following equation:

PF=W/VA

SIN(Phase Angle) is calculated using the following equation:

PF=Var/VA

Additionally, in an embodiment, meter security is also implemented in software or firmware by providing a means of allowing only authorized users from reading/writing meter data through the communication channels. Any one with a provisioning tool or meter key (MK) has access to all procedures and tables. However, this can be limited at the end of production via usage of a control word to lock out features such as calibration data, tables, and possibly software download. Using a provisioning key (PK) one can write the control word only when PK is enabled and control word equals zero. However, the PK cannot be used to download firmware. A transceiver unit key allows one to write to the processor of the transceiver unit during production. This key can be changed in the field by the meter microcontroller (upon changing of the key by the DCX in the meter) and can be used to download firmware in the field. A read only key (RK) can be used to read almost all data but has no access to key procedures.

Time-of-use (TOU) is the term used to describe the partitioning of energy usage into different storage devices based on a schedule. In one embodiment the meter supports four such devices called tariffs. The tariffs are selected for different time periods within a day (midnight to midnight). The time at which a tariff is changed is called a tier switch. Each 24-hour set of tier switches is called a day schedule. There are different day schedules for weekdays, Saturday, Sunday, and holidays. Each year is identical with regards to season changes, holidays, and daylight savings switches. This is called a perpetual calendar implementation. All of the measured energy values are stored as totals, not calendar based, and into the four tariff registers based on the TOU schedule.

In one embodiment, self-read is the term used to describe the automatic, periodic storage of measurement data to a separate area of memory that can be read for billing purposes. Self-reads provide a mechanism for all meters with the same self-read schedule to record billing data at the same time of day. The meter is capable of performing a self-read or snapshot of the billing registers at a predefined interval. All of the total energy measurement data provided and all four tier registers will be captured during a self-read event. A host system or provisioning software can configure the meter via the TOU calendar to perform a self-read daily, weekly, monthly, or some other period of days. The host system (utility provider) can then collect this information some time after the meter has performed the self-read action. Whether or not the self-read data is read, the meter will not interrupt the programmed schedule and old data will be overwritten with new data when the self-read is scheduled to occur. If the meter is powered down at the time a self-read was scheduled to occur, the self-read will be recorded at the subsequent power-up with the timestamp of the power-up event. The meter will store to a separate area of memory the day's consumption for all of the total energy measurements (excluding tariff registers). This storage will contain only the previous day's energy consumption. This snapshot of total energy may be used by a host system to determine total usage of the secondary side of a transformer.

An embodiment of the meter contains two internal control outputs that can be used to control two independent devices. The primary control output is used to control a circuit disconnect that controls the load to the customer and can be programmed for use in one of three different applications: maximum power level control with programmable trip point, prepay metering when the credit has run to zero, and local or remote manual control of the control output.

In one embodiment the second control output can be used to drive an external relay that controls an external device such as a water heater based on the current tariff level, or manually via a procedure.

In one embodiment the primary, or circuit disconnect control, output may be "tripped" if the customer's power consumption has exceeded the preset limit. This limit can be programmed into the meter or can be stored by the utility provider. The active power (active forward+active reverse) must be equal to or exceed the programmable trip value for the programmable amount of time. The programmable trip value is only used for this disconnect trip purpose. The programmable trip value is only valid for active power.

In one embodiment the meter must maintain a log of events that have occurred. This log will include but be limited to information such as the time of the event, the event code and optional event data. The events that can be logged by the meter are detailed in stored in a table.

Calibration

Meter calibration is required to at least meet IEC requirements for accuracy. In one embodiment, the meter supports several different types of calibration selected from the group including but not limited to main calibration, power factor calibration, frequency calibration, temperature calibration, DC component elimination, phase loss detect, anti-creep, analog gain switching, clock calibration, and self-calibration.

Main calibration is used to compensate for the measurement errors caused by tolerance in the components used for metering hardware. The purpose of main calibration is to compensate for measurement errors caused by tolerances in the components used for metering hardware. The meter has to be calibrated and tested at its rated frequency to assure the meter is optimized to its rated frequency. Main calibration includes gain and offset calibration. The calibration parameters for main calibration are calculated at rated frequency, unity power factor, and room temperature. Power factor error is caused by the tolerances of components used in the measurement hardware, which results in a variation between phase angles for voltage and current inputs. A dynamic gain adjust method will be used to compensate power factor errors. When the main frequency deviates from a reference frequency (e.g., 50 Hz) errors will be seen due to the nonlinear frequency response of the meter. Frequency compensation is necessary when the error exceeds at least the IEC accuracy requirements. Also, meter measurements will drift as the ambient temperature of the metering enclosure changes. Temperature compensation is used to correct this drift which can be caused by environmental temperature changes or self-heating.

As the reference voltage input to the meter may change over time, in an embodiment, DC component elimination is used to help maintain the meter's accuracy over time. The following formula is used to calculate the DC component:

$$Vref = \left(\sum_{j=0}^{M-1}\left(\sum_{i=0}^{N-1} Sample_i\right)\right)/M$$

Where N=number of samples in a period, M=number of main cycles, and Sample=samples of the input voltage or current.

In one embodiment, the meter supports self-calibration. Using pre-programmed calibration points the meter can auto detect the current setting and apply an appropriate calibration constant. In another embodiment, this self-calibration capability can be used during the manufacturing process. FIG. 22 depicts an exemplary self-calibration procedure to be used during the manufacturing process.

The clock The RTC must provide a level of accuracy as specified in IEC 61038. Clock accuracy error can be introduced by two means: temperature effects and aging of the crystal. In an embodiment, correction based on crystal aging is applied through the NES system. During normal meter operation, a host device must periodically read the meter clock and perform necessary adjustments. Calibration and correction based on temperature effects needs to be done to ensure the relative accuracy of the system clock across temperature ranges. Initial calibration will be done at manufacturing. During operation with the correction applied and based on real-time meter temperature the clock will be tested and adjusted if necessary at set periods. During watch mode, the last recorded temperature before AC power was removed is used to correct the RTC.

In one embodiment, the meter will periodically perform self-tests and set a flag to indicate the alarm condition was detected. Self-tests will not clear any alarms if the alarm condition no longer persists. It will be the responsibility of the DCX or optical reader to clear the necessary alarms. A table contains flags for the possible alarm conditions and another table defines which error codes are to be shown on the LCD display. Some self-tests are performed periodically (every second, minute, hour, daily or weekly), some self tests are performed on power up only, while other self tests are performed on request.

Thus a meter and a metering communication system have been described.

We claim:
1. A metering apparatus comprising:
a microcomputer (MCU);
a transceiver unit coupled to the MCU to transmit and receive power line communications (PLC) between the metering apparatus and a remote device;
memory coupled to the MCU to store metering data;
a communication device coupled to the MCU;
at least one analog transducer coupled to the MCU to supply real time data to the MCU;
an electronically operated relay coupled to the MCU to disconnect the metering apparatus from one or more line outputs;
a battery to provide power to the MCU such that at least of portion of the MCU's functionality when main power is off including detecting tampering of the meter; and
a cold start interrupt in communication with the MCU to change the metering apparatus' mode operation from stop mode to normal mode, wherein the MCU is the only active component powered on and a power source for the metering apparatus is the battery and all clocks used by the MCU are turned off when the metering apparatus is in stop mode and when the metering apparatus is in normal mode the MCU and other components of the meter are fully powered and a real-time clock is generated.

2. The at least one analog transducer of claim 1, further comprising:
voltage sensors supplying real time power measurement and power quality data;
current sensors supplying real time current measurements;
a temperature sensor;
a battery level detection sensor; and
pulse input and tamper detect sensors.

3. The transceiver unit of claim 1, further comprising:
a processing core; and
a power line transceiver.

4. The memory of claim 1, further comprising:
storage for American National Standards Institute (ANSI) based meter tables, profiling data and calibration data.

5. The metering apparatus of claim 1, further comprising:
analog gain control circuitry coupled with the MCU providing amplified output of the low current range input.

6. The communication device of claim 1, further comprising:
an optical interface.

7. The metering apparatus of claim 1, further comprising:
a cold start interrupt in communication with the MCU to change the metering apparatus' mode operation from watch mode to normal mode, wherein the MCU is the only active component powered on and the power source for the metering apparatus is a battery and a real time clock is generated when the metering apparatus is in watch mode and when the metering apparatus is in normal mode the MCU and other components of the meter are fully powered and a real-time clock is generated.

8. The metering apparatus of claim 1, further comprising:
battery management circuitry coupled to the MCU to monitor battery voltage level.

9. The metering apparatus of claim 1, further comprising:
tamper management circuitry coupled to the MCU to monitor for any tampering of the meter by removing the cover.

10. The metering apparatus of claim 1, further comprising:
a relay in communication with the MCU for line output disconnect.

11. The relay of claim 10, further comprising:
an electronically controllable relay capable of switching loads up to 100 Amperes.

12. The metering apparatus of claim 1, further comprising:
a S0 output in communication with the MCU as a real-time indication of active energy.

13. The S0 output of claim 12, further comprising:
a configurable output.

14. A meter comprising:
a microcomputer (MCU);
memory coupled to the MCU to store metering data;
at least one analog transducer coupled to the MCU to supply real time data to the MCU; and
a secondary power source to provide power to the MCU such that at least of portion of the MCU's functionality when main power is off including detecting tampering of the meter, wherein the meter has at least three modes of operation comprising:
 a normal mode wherein when in the normal mode all components of the meter are fully powered, a real-time clock is generated, and a main power source for the meter is main power;
 a watch mode wherein when in the watch mode the MCU is the only active component fully powered, a real-time clock is generated, and the power source for the meter is the secondary power source; and
 a stop mode wherein when in the stop mode the MCU is the only active component powered, clocks used by the MCU are turned off, and the power source for the meter is the secondary power source.

15. The meter of claim 14, further comprising:
a transceiver unit coupled to the MCU to transmit and receive power line communications (PLC) between the meter and a remote device.

16. The meter of claim 14, further comprising:
a communication device coupled to the MCU to convey the metering data to an external handheld device.

17. The meter of claim 14, further comprising:
an electronically operated relay coupled to the MCU to disconnect the meter from one or more line outputs.

18. A meter comprising:
memory to store metering data; and
a microcomputer (MCU) coupled to the memory, wherein the meter has at least three modes of operation comprising:
 a normal mode wherein when in the normal mode all components of the meter are fully powered, a real-time clock is generated, and the power source for the meter is main power;
 a watch mode wherein when in the watch mode the MCU is the only active component fully powered, a real-time clock is generated, and the power source for the meter is a secondary power source; and
 a stop mode wherein when in the stop mode the MCU is the only active component powered, clocks used by the MCU are turned off, and the power source for the meter is a secondary power source.

19. The meter of claim 18, further comprising:
a transceiver unit coupled to the MCU to transmit and receive power line communications (PLC) between the meter and a remote device.

20. The meter of claim 18, further comprising:
a communication device coupled to the MCU to convey the metering data to an external handheld device.

21. The meter of claim 18, further comprising:
an electronically operated relay coupled to the MCU to disconnect the meter from one or more line outputs.

22. A metering apparatus comprising:
a microcomputer (MCU);
a transceiver unit coupled to the MCU to transmit and receive power line communications (PLC) between the metering apparatus and a remote device;
memory coupled to the MCU to store metering data;
a communication device coupled to the MCU;
at least one analog transducer coupled to the MCU to supply real time data to the MCU;
an electronically operated relay coupled to the MCU to disconnect the metering apparatus from one or more line outputs; and
a battery to provide power to the MCU such that at least of portion of the MCU's functionality when main power is off including detecting tampering of the meter,
wherein the meter has at least three modes of operation including, a normal mode wherein when in the normal mode all components of the meter are fully powered, a real-time clock is generated, and the power source for the meter is main power;
 a watch mode wherein when in the watch mode the MCU is the only active component fully powered, a real-time clock is generated, and the power source for the meter is a secondary power source; and
 a stop mode wherein when in the stop mode the MCU is the only active component powered, clocks used by the MCU are turned off, and the power source for the meter is a secondary power source.

23. The at least one analog transducer of claim 22, further comprising:
voltage sensors supplying real time power measurement and power quality data;
current sensors supplying real time current measurements;
a temperature sensor;
a battery level detection sensor; and
pulse input and tamper detect sensors.

24. The transceiver unit of claim 22, further comprising:
a processing core; and
a power line transceiver.

25. The memory of claim 22, further comprising:
storage for American National Standards Institute (ANSI) based meter tables, profiling data and calibration data.

26. The metering apparatus of claim 22, further comprising:
analog gain control circuitry coupled with the MCU providing amplified output of the low current range input.

27. The metering apparatus of claim 22, further comprising:
a relay in communication with the MCU for line output disconnect.

28. The relay of claim 27, further comprising:
an electronically controllable relay capable of switching loads up to 100 Amperes.

29. The communication device of claim 22, further comprising:
an optical interface.

30. The metering apparatus of claim 22, further comprising:
a S0 output in communication with the MCU as a real-time indication of active energy.

31. The S0 output of claim 30, further comprising:
a configurable output.

* * * * *